US010651820B2

(12) United States Patent
Kippenberg et al.

(10) Patent No.: US 10,651,820 B2
(45) Date of Patent: May 12, 2020

(54) SIGNAL PROCESSING APPARATUS AND METHOD FOR TRANSMITTING AND RECEIVING COHERENT PARALLEL OPTICAL SIGNALS

(71) Applicant: Ecole Polytechnique Federale de Lausanne (EPFL), Lausanne (CH)

(72) Inventors: Tobias Kippenberg, Lausanne (CH); Christian Koos, Karlsruhe (DE); Pablo Marin-Palomo, Karlsruhe (DE); Juned Nassir Kemal, Karlsruhe (DE)

(73) Assignee: Ecole Polytechnique Federale de Lausanne (EPFL), Lausanne (CH)

( * ) Notice: Subject to any disclaimer, the term of this patent is extended or adjusted under 35 U.S.C. 154(b) by 51 days.

(21) Appl. No.: 15/703,704

(22) Filed: Sep. 13, 2017

(65) Prior Publication Data

US 2018/0083599 A1   Mar. 22, 2018

Related U.S. Application Data

(60) Provisional application No. 62/395,578, filed on Sep. 16, 2016.

(51) Int. Cl.
  *H04B 10/508* (2013.01)
  *H03H 9/24* (2006.01)
  (Continued)

(52) U.S. Cl.
  CPC ........ *H03H 9/2431* (2013.01); *H03H 3/0072* (2013.01); *H03H 9/02244* (2013.01);
  (Continued)

(58) Field of Classification Search
  None
  See application file for complete search history.

(56) References Cited

U.S. PATENT DOCUMENTS 5,696,859 A  * 12/1997  Onaka ................ G02B 6/12007
                                                      372/20
7,561,807 B2 *  7/2009  Doerr ..................... H04B 10/60
                                                      359/326
(Continued)

FOREIGN PATENT DOCUMENTS

WO    WO-2014131425 A1 *  9/2014  ........... G02F 1/3513

OTHER PUBLICATIONS

Xue et al., Thermal tuning of Kerr frequency combs in silicon nitride microring resonators, Jan. 2016, OSA, pp. 687-698 (Year: 2016).*

(Continued)

*Primary Examiner* — Jai M Lee
(74) *Attorney, Agent, or Firm* — Caesar Rivise, PC

(57) ABSTRACT

A signal processing apparatus, being configured for transmitting and receiving coherent parallel optical signals, comprises a transmitter apparatus including a first single soliton micro-resonator device and a modulator device, wherein the first single soliton micro-resonator device is adapted for creating a single soliton providing a first frequency comb, wherein the first frequency comb provides a plurality of equidistant optical carriers with a frequency spacing corresponding to a free spectral range of the first single soliton micro-resonator device, and the modulator device is adapted for modulating the optical carriers according to data to be transmitted, and a receiver apparatus including a coherent receiver device with a plurality of coherent receivers and a local oscillator device providing a plurality of reference optical signals, wherein the coherent receiver device and the local oscillator device are arranged for coherently detecting the transmitted modulated optical carriers, wherein the signal processing apparatus further includes at least one second single soliton micro-resonator device having a free spectral range being equal or approximated to the free spectral range (Continued)

of the first single soliton micro-resonator device and being adapted for creating at least one single soliton providing at least one second frequency comb, wherein the at least one second frequency comb provides at least one of additional optical carriers and the reference optical signals. Furthermore, a signal processing method, including transmitting and receiving coherent parallel optical signals via a communication channel is described.

29 Claims, 9 Drawing Sheets

(51) Int. Cl.
  H03H 9/50    (2006.01)
  H03H 3/007   (2006.01)
  H03H 9/02    (2006.01)
  H03H 9/46    (2006.01)
  H04B 10/50   (2013.01)
  H04B 10/61   (2013.01)
  H04J 14/06   (2006.01)
  H04B 10/63   (2013.01)
  H04J 14/02   (2006.01)

(52) U.S. Cl.
  CPC ............ H03H 9/462 (2013.01); H03H 9/505 (2013.01); H04B 10/506 (2013.01); H04B 10/508 (2013.01); H04B 10/614 (2013.01); H04B 10/63 (2013.01); H04J 14/02 (2013.01); H04J 14/06 (2013.01); H03H 2009/02496 (2013.01)

(56) References Cited

U.S. PATENT DOCUMENTS

| | | | |
|---|---|---|---|
| 8,320,760 B1* | 11/2012 | Lam | H04J 14/0257 398/66 |
| 8,374,512 B2* | 2/2013 | Tao | H04B 10/61 398/202 |
| 9,348,194 B2 | 5/2016 | Herr et al. | |
| 9,628,316 B2* | 4/2017 | Yi | H04L 27/26 |
| 9,705,599 B2* | 7/2017 | Dangui | H04J 14/0279 |
| 10,009,106 B2* | 6/2018 | Doerr | H04B 10/505 |
| 2003/0007157 A1* | 1/2003 | Hulse | G02B 6/2713 356/491 |
| 2003/0202232 A1* | 10/2003 | Frignac | G02B 6/29358 359/279 |
| 2010/0178057 A1* | 7/2010 | Shieh | H04L 25/0224 398/79 |
| 2011/0020003 A1* | 1/2011 | Yu | H04B 10/548 398/79 |
| 2011/0069975 A1* | 3/2011 | Liu | H04B 10/61 398/202 |
| 2011/0182584 A1* | 7/2011 | Gottwald | H04B 10/516 398/79 |
| 2013/0177027 A1* | 7/2013 | Rasras | H04J 14/002 370/464 |
| 2014/0110572 A1* | 4/2014 | Li | G01J 1/0209 250/227.23 |
| 2014/0205286 A1* | 7/2014 | Ji | H04B 10/40 398/45 |
| 2014/0328588 A1* | 11/2014 | Sakai | H04B 10/63 398/38 |
| 2015/0323818 A1* | 11/2015 | Padmaraju | H01S 5/06832 359/288 |
| 2016/0011489 A1* | 1/2016 | Herr | H01S 3/0092 385/2 |
| 2016/0124285 A1* | 5/2016 | Lowell | H01S 3/0078 359/326 |
| 2016/0261351 A1* | 9/2016 | Raybon | G02B 6/2861 |
| 2017/0019178 A1* | 1/2017 | Alic | H04B 10/2543 |
| 2017/0078029 A1* | 3/2017 | Qi | H04L 7/0008 |
| 2018/0006730 A1* | 1/2018 | Kuo | H04B 10/615 |
| 2018/0006790 A1* | 1/2018 | Park | H04L 5/001 |
| 2018/0083414 A1* | 3/2018 | Weiner | G02F 1/0121 |
| 2018/0291731 A1* | 10/2018 | Stark | E21B 47/123 |

OTHER PUBLICATIONS

Ataie et al. (2015). Ultrahigh count coherent WDM channels transmission using optical parametric comb-based frequency synthesizer. Journal of Lightwave Technology, 33(3), 694-699.

Azadeh et al. (2015). Low V π Silicon photonics modulators with highly linear epitaxially grown phase shifters. Optics express, 23(18), 23526-23550.

Bergano et al. (1996). Wavelength division multiplexing in long-haul transmission systems. Journal of Lightwave technology, 14(6), 1299-1308.

Bozinovic et al. (2013). Terabit-scale orbital angular momentum mode division multiplexing in fibers. Science, 340 (6140), 1545-1548.

Brasch et al. (2016). Photonic chip—based optical frequency comb using soliton Cherenkov radiation. Science, 351 (6271), 357-360.

Carmon et al. (2004). Dynamical thermal behavior and thermal self-stability of microcavities. Optics Express, 12(20), 4742-4750.

Chang et al. (2010). Forward error correction for 100 G transport networks. IEEE Communications Magazine, 48(3), S48-S55.

Dai et al. (2014). Silicon-based on-chip multiplexing technologies and devices for Peta-bit optical interconnects. Nanophotonics, 3(4-5), 283-311.

Del'Haye et al. (2007). Optical frequency comb generation from a monolithic micro-resonator. Nature 450, 1214-1217.

Dong et al. (2014). Monolithic silicon photonic integrated circuits for compact 100+ Gb/s coherent optical receivers and transmitters. IEEE Journal of Selected Topics in Quantum Electronics, 20(4), 1-8.

Guo et al. (2017). Universal dynamics and deterministic switching of dissipative Kerr solitons in optical microresonators. Nature Physics, 13(1), 94-103.

Haelterman et al. (1992). Dissipative modulation instability in a nonlinear dispersive ring cavity. Optics communications, 91(5-6), 401-407.

Hasegawa et al. (1981). Signal transmission by optical solitons in monomode fiber. Proceedings of the IEEE, 69(9), 1145-1150.

Hasegawa et al. (1973). Transmission of stationary nonlinear optical pulses in dispersive dielectric fibers. II. Normal dispersion. Applied Physics Letters, 23(4), 171-172.

Hasegawa et al. (1995). Ch. 12: Soliton transmission experiments. In Solitons in Optical Communications. (Clarendon Press 1995). pp. 218-249.

Haus et al. (1996). Solitons in optical communications. Reviews of modern physics, 68(2), 423-444.

Herr et al. (2014). Temporal solitons in optical microresonators. Nature Photonics, 8(2), 145-152.

Herr et al. (2012). Universal formation dynamics and noise of Kerr-frequency combs in microresonators. Nature Photonics, 6(7), 480-487.

Hillerkuss et al. (2011). 26 Tbit s-1 line-rate super-channel transmission utilizing all-optical fast Fourier transform processing. Nature Photonics, 5(6), 364-371.

Hillerkuss et al. (2012). Single-laser 32.5 Tbit/s Nyquist WDM transmission. Journal of Optical Communications and Networking, 4(10), 715-723.

Hu et al. (2016). Single-source AlGaAs frequency comb transmitter for 661 Tbit/s data transmission in a 30-core fiber. In CLEO: QELS_Fundamental Science (pp. JTh4C-1). Optical Society of America. pp. 1-2.

Kachris et al. (2012). A survey on optical interconnects for data centers. IEEE Communications Surveys & Tutorials, 14(4), 1021-1036.

Kan et al. (2017). 42.3 Tbit/s, 18 Gbaud 64 QAM WDM coherent transmission over 160 km in the C-band using an injection-locked homodyne receiver with a spectral efficiency of 9 bits/Hz. Optics express, 25(19), 22726-22737.

(56) References Cited

OTHER PUBLICATIONS

Karpov et al. (2015). Raman induced soliton self-frequency shift in microresonator Kerr frequency combs. arXiv preprint arXiv:1506.08767, pp. 1-6.
Karpov et al. (2016). Raman self-frequency shift of dissipative Kerr solitons in an optical microresonator. Physical review letters, 116(10), 103902:1-5.
Kemal et al. (2015) Parallel multi-wavelength intradyne reception using an optical frequency comb as a local oscillator. In Optical Communication (ECOC), 2015 European Conference on (pp. 1-3). IEEE.
Kippenberg et al. (2011). Micro-resonator-Based Optical Frequency Combs. Science 332, 555-559.
Kordts et al. (2016). Higher order mode suppression in high-Q anomalous dispersion SiN microresonators for temporal dissipative Kerr soliton formation. Optics letters, 41(3), 452-455.
Levy et al.(2010). CMOS-compatible multiple-wavelength oscillator for on-chip optical interconnects. Nature photonics, 4(1), 37-40.
Liang et al. (2010). Recent progress in lasers on silicon. Nature photonics, 4(8), 511-517.
Lugiato et al. (1987). Spatial dissipative structures in passive optical systems. Physical review letters, 58(21), 2209-2211.
Mollenauer et al. (1980). Experimental observation of picosecond pulse narrowing and solitons in optical fibers. Physical Review Letters, 45(13), 1095-1098.
Nakazawa et al. (1991). 10 Gbit/s soliton data transmission over one million kilometres. Electronics Letters, 27(14), 1270-1272.
Niakazawa et al. (2013). Ch. 7: Extremely Higher-Order Modulation Formats. In Kaminow, I., Li, T. & Willner, A. E. Optical Fiber Telecommunications. Volume VIA, Sixth Edition: Components and Subsystems. (Academic Press, Oxford, 2013), pp. 297-336.
PFAU et al. (2009). Hardware-efficient coherent digital receiver concept with feedforward carrier recovery for M-QAM constellations. Journal of Lightwave Technology, 27(8), 989-999.
Pfeiffer et al. (2016). Photonic Damascene process for integrated high-Q microresonator based nonlinear photonics. Optica, 3(1), 20-25.
Pfeifle et al. (2014). Coherent terabit communications with microresonator Kerr frequency combs. Nature photonics, 8(5), 375-380.
Pfeifle et al. (2015). Flexible terabit/s Nyquist-WDM super-channels using a gain-switched comb source. Optics express, 23(2), 724-738.
Pfeifle et al. (2015). Full C and L-band transmission at 20 Tbit/s using cavity-soliton Kerr frequency combs. In CLEO: Science and Innovations (pp. JTh5C-8). Optical Society of America. pp. 1-2.
Puttnam et al. (2015). 2.15 Pb/s transmission using a 22 core homogeneous single-mode multi-core fiber and wideband optical comb. In Optical Communication (ECOC), 2015 European Conference on (pp. 1-3). IEEE.
Temprana et al. (2015). Overcoming Kerr-induced capacity limit in optical fiber transmission. Science, 348(6242), 1445-1448.
Turitsyn et al. (2008). Dissipative nonlinear structures in fiber optics. Lect. Notes Phys. 751, 195-220.
Vujicic et al. (2015). Quantum dash passively mode-locked lasers for Tbit/s data interconnects. In Optical Fiber Communications Conference and Exhibition (OFC), 2015 (pp. 1-3). IEEE.
Wang et al. (2012). Terabit free-space data transmission employing orbital angular momentum multiplexing. Nature Photonics, 6(7), 488-496.
Wang et al. (2016). Intracavity characterization of micro-comb generation in the single-soliton regime. Optics express, 24(10), 10890-10897.
Wang et al. (2015). Room-temperature InP distributed feedback laser array directly grown on silicon. Nature Photonics, 9(12), 837-842.
Weimann et al. (2014). Silicon-organic hybrid (SOH) frequency comb sources for terabit/s data transmission. Optics express, 22(3), 3629-3637.
Winzer et al. (2010). Spectrally efficient long-haul optical networking using 112-Gb/s polarization-multiplexed 16-QAM. Journal of lightwave technology, 28(4), 547-556.
Xue et al. (2015). Mode-locked dark pulse Kerr combs in normal-dispersion microresonators. Nature Photonics, 9(9), 594-600.
Yi et al. (2016). Active capture and stabilization of temporal solitons in microresonators. Optics letters, 41(9), 2037-2040.
Yi et al. (2015). Soliton frequency comb at microwave rates in a high-Q silica microresonator. Optica, 2(12), 1078-1085.

* cited by examiner

A

B

SIGNAL PROCESSING APPARATUS AND METHOD FOR TRANSMITTING AND RECEIVING COHERENT PARALLEL OPTICAL SIGNALS

CROSS-REFERENCE TO RELATED APPLICATIONS

This application claims the benefit of U.S. Application No. 62/395,578, filed Sep. 16, 2016, the contents of which application are incorporated herein by reference in their entireties for all purposes.

FIELD OF THE INVENTION

The present invention relates to a signal processing apparatus for transmitting and receiving coherent parallel optical signals, in particular comprising a transmitter apparatus with a first single soliton micro-resonator, like a micro-ring resonator, and a modulator device, and a receiver apparatus with a coherent receiver device having a plurality of coherent receivers and a local oscillator device. Furthermore, invention relates to the transmitter apparatus and to the receiver apparatus, being adapted for transmitting and receiving coherent parallel optical signals, resp. Furthermore, the invention relates to methods of transmitting and receiving coherent parallel optical signals. Applications of the invention are available in particular in optical data processing and telecommunications.

TECHNICAL BACKGROUND

In the present specification, reference is made to the following publications cited for illustrating prior art techniques.
1. Hasegawa, A. & Tappert, F. Transmission of stationary nonlinear optical pulses in dispersive dielectric fibers. II. Normal dispersion. Appl. Phys. Lett. 23, 171-172 (1973).
2. Hasegawa, A. & Kodama, Y. Signal Transmission by Optical Solitons in Monomode Fiber. Proc. IEEE 69, 1145-1150 (1981).
3. Herr, T. et al. Temporal solitons in optical micro-resonators. Nat. Photonics 8, 145-152 (2013).
4. Brasch, V. et al. Photonic chip-based optical frequency comb using soliton Cherenkov radiation. Science 351, 357-360 (2015).
5. Bozinovic, N. et al. Terabit-scale orbital angular momentum mode division multiplexing in fibers. Science 340, 1545-1548 (2013).
6. Wang, J. et al. Terabit free-space data transmission employing orbital angular momentum multiplexing. Nat. Photonics 6, 488-496 (2012).
7. Puttnam, B. J. et al. 2.15 Pb/s Transmission Using a 22 Core Homogeneous Single-Mode Multi-Core Fiber and Wideband Optical Comb. In *European Conference on Optical Communications*, paper PDP3.1 (2015).
8. Dai, D. & Bowers, J. E. Silicon-based on-chip multiplexing technologies and devices for Peta-bit optical interconnects. Nanophotonics 3, 283-311 (2014).
9. Mollenauer, L. F., Stolen, R. H. & Gordon, J. P. Experimental observation of picosecond pulse narrowing and solitons in optical fibers. Phys. Rev. Lett. 45, 1095-1098 (1980).
10. Haus, H. A. & Wong, W. S. Solitons in optical communications. Rev. Mod. Phys. 68, 423-444 (1996).
11. Möbius, P. Hasegawa, A. Kodama, Y.: Solitons in Optical Communications. Oxford, Clarendon Press 1995. XIV.
12. Nakazawa, M., Yamada, E., Kubota, H. & Suzuki, K. 10 Gbit/s Soliton Data Transmission over One Million Kilometres. Electron. Lett. 27, 1270-1272 (1991).
13. Hillerkuss, D. et al. 26 Tbit s−1 line-rate super-channel transmission utilizing all-optical fast Fourier transform processing. Nat. Photonics 5, 364-371 (2011).
14. Ataie, V. et al. Ultrahigh Count Coherent WDM Channels Transmission Using Optical Parametric Comb Based Frequency Synthesizer. J. Light. Technol. 33, 694-699 (2015).
15. Hillerkuss, D. et al. Single-Laser 32.5 Tbit/s Nyquist WDM Transmission. J. Opt. Commun. Netw. 4, 715-723 (2012).
16. Temprana, E. et al. Overcoming Kerr-induced capacity limit in optical fiber transmission. Science 348, 1445-1448 (2015).
17. Weimann, C. et al. Silicon-organic hybrid (SOH) frequency comb sources for terabit/s data transmission. Opt. Express 22, 3629 (2014).
18. Pfeifle, J. et al. Flexible terabit/s Nyquist-WDM superchannels using a gain-switched comb source. Opt. Express 23, 724 (2015).
19. Vujicic, V. et al. Quantum Dash Passively Mode-Locked Lasers for Tbit/s Data Interconnects. In *Optical Fiber Communication Conference*, paper Tu3I.4 (OSA, 2015).
20. Hu, H. et al. Single-Source AlGaAs Frequency Comb Transmitter for 661 Tbit/s Data Transmission in a 30-core Fiber. In *CLEO: 2016 Postdeadline Paper Digest* JTh4C.1 (OSA, 2016).
21. Kemal, J. N. et al. Parallel Multi-Wavelength Intradyne Reception Using an Optical Frequency Comb as a Local Oscillator. In ECOC Proceedings P. 4.18 (2015).
22. Del'Haye, P. et al. Optical frequency comb generation from a monolithic micro-resonator. Nature 450, 1214-7 (2007).
23. Levy, J. S. et al. CMOS-compatible multiple-wavelength oscillator for on-chip optical interconnects. Nat. Photonics 4, 37-40 (2009).
24. Herr, T. et al. Universal formation dynamics and noise of Kerr-frequency combs in micro-resonators. Nat. Photonics 6, 480-487 (2012).
25. Kippenberg, T. J., Holzwarth, R. & Diddams, S. A. Micro-resonator-Based Optical Frequency Combs. Science 332, 555-559 (2011).
26. Xue, X. et al. Mode-locked dark pulse Kerr combs in normal-dispersion micro-resonators. Nat Phot. 9, 594-600 (2015).
27. Dong, P. et al. Monolithic Silicon Photonic Integrated Circuits for Compact 100+Gb/s Coherent Optical Receivers and Transmitters. IEEE J. Sel. Top. Quantum Electron. 20, 1-8 (2014).
28. Azadeh, S. S. et al. Low V Silicon photonics modulators with highly linear epitaxially grown phase shifters. Opt. Express 23, 23526 (2015).
29. Liang, D. & Bowers, J. E. Recent progress in lasers on silicon. Nat. Photonics 4, 511-517 (2010).
30. Wang, Z. et al. Room Temperature InP DFB Laser Array Directly Grown on (001) Silicon. Nat. Photonics 9, 837-842 (2015).
31. Pfeifle, J. et al. Coherent terabit communications with micro-resonator Kerr frequency combs. Nat. Photon. 8, 375-380 (2014).

32. Pfeifle, J. et al. Full C and L-Band Transmission at 20 Tbit/s Using Cavity-Soliton Kerr Frequency Combs. In *CLEO: 2015 Postdeadline Paper Digest* JTh5C.8 (OSA, 2015).
33. Haelterman, H., Trillo, S. & Wabnitz, S. Dissipative modulation instability in a nonlinear dispersive ring cavity. *Opt. Commun.* 91, 401-407 (1992).
34. Akhmediev, N. *Dissipative Solitons: From Optics to Biology and Medicine.* (Springer, 2008).
35. Yi, X., Yang, Q.-F., Yang, K. Y., Suh, M.-G. & Vahala, K. Soliton frequency comb at microwave rates in a high-Q silica micro-resonator. *Optica* 2, 1078 (2015).
36. Kachris, C. & Tomkos, I. A survey on optical interconnects for data centers. *IEEE Commun. Surv. Tutorials* 14, 1021-1036 (2012).
37. Lugiato, L. A. & Lefever, R. Spatial Dissipative Structures in Passive Optical Systems. *Phys. Rev. Lett.* 58, 2209 (1987).
38. Karpov, M. et al. Universal dynamics and controlled switching of dissipative Kerr solitons in optical micro-resonators. at arXiv:1601.05036 (2016).
39. Yi, X., Yang, Q., Ki, Y. Y. & Vahala, K. Active capture and stabilization of temporal solitons in micro-resonators. *Opt. Lett.* 41, 2037-2040 (2016)
40. Chang, F., Onohara, K. & Mizuochi, T. Forward error correction for 100 G transport networks. *IEEE Commun. Mag.* 48, 48-55 (2010).
41. Kaminow, I., Li, T. & Willner, A. E. *Optical Fiber Telecommunications.* Volume VIA, Sixth Edition: Components and Subsystems. Ch. 7 (Academic Press, Oxford, 2013).
42. Pfeiffer, M. H. P. et al. Photonic Damascene process for integrated high-Q micro-resonator based nonlinear photonics. *Optica* 3, 20-25 (2016).
43. Kordts, A., Pfeiffer, M., Guo, H., Brasch, V. & Kippenberg, T. J. Higher order mode suppression in high-Q anomalous dispersion SiN micro-resonators for temporal dissipative Kerr soliton formation. *Opt. Lett.* 41, 452-455 (2015).
44. Pfau, T., Hoffmann, S. & Noe, R. Hardware-Efficient Coherent Digital Receiver Concept With Feedforward Carrier Recovery for M-QAM Constellations. *Light. Technol. J.* 27, 989-999 (2009).
45. Wang, P. et al. Intracavity characterization of microcomb generation in the single-soliton regime. at arXiv: 1603.03154 (2016).
46. Carmon, T., Yang, L. & Vahala, K. Dynamical thermal behavior and thermal self-stability of microcavities. *Opt. Express* 12, 4742-4750 (2004).
47. Karpov, M. et al. Raman induced soliton self-frequency shift in micro-resonator Kerr frequency combs. *Arxiv* (2015). at arXiv:1506.08767 (2015).
48. Winzer, P. J., Gnauck, A. H., Doerr, C. R., Magarini, M. & Buhl, L. L. Spectrally efficient long-haul optical networking using 112-Gb/s polarization-multiplexed 16-QAM. *J. Light. Technol.* 28, 547-556 (2010).
49. Bergano, N. S., Member, S. & Davidson, C. R. Wavelength Division Multiplexing in Long-Haul Transmission Systemns. *J. Light. Technol.* 14, (1996).
50. U.S. Pat. No. 9,348,194.

Optical solitons are waveforms that preserve their shape while travelling, relying on a balance of dispersion and nonlinearity[1,2]. Data transmission schemes using solitons were heavily investigated in the 1980's promising to overcome the limitations imposed by dispersion of optical fibers. These approaches, however, were eventually abandoned in favour of wavelength-division multiplexing (WDM) schemes, that are easier to implement and offer much better scalability to higher data rates. Optical solitons may experience a comeback in optical terabit communications, this time not as a competitor, but as a key element of massively parallel WDM. Instead of encoding data on the soliton itself, continuously circulating solitons in Kerr-nonlinear micro-resonators can be exploited to generate broadband optical frequency combs[3,4].

The first observation of solitons in optical fibers[9] in 1980 was immediately followed by major research efforts to harness such waveforms for long-haul communications beyond the limits imposed by chromatic dispersion in optical fibers[10,11]. In these schemes, data was encoded onto a soliton pulse train by simple amplitude modulation using on-off-keying (OOK). However, even though the viability of the approach was experimentally demonstrated by transmission of data streams over one million kilometres[12], the vision of soliton-based communications was ultimately hindered by difficulties in achieving shape-preserving propagation in real transmission systems[10]. Moreover, with the advent of wavelength-division multiplexing (WDM), line rates in long-haul communication systems could be increased by rather simple parallel transmission of data streams with lower symbol rates, for which dispersion represents much less of a problem. As a consequence, soliton-based communication schemes have moved out of focus over the last two decades.

More recently, frequency combs were demonstrated to hold promise for revolutionizing high-speed optical communications, offering tens or even hundreds of well-defined narrowband optical carriers for massively parallel WDM[7,13-15]. Unlike carriers derived from a bank of individual laser modules, the tones of a comb are intrinsically equidistant in frequency, thereby eliminating the need for individual wavelength control of each carrier and for inter-channel guard bands[7,15]. In addition, stochastic frequency variations of the carriers are strongly correlated, which enables efficient compensation of impairments caused by nonlinearities of the transmission fiber[16].

For application in optical communications, frequency comb sources must be integrated into ultra-compact transmitter and receiver systems. Over the last years, a wide variety of chip-scale frequency comb sources have been demonstrated, including modulator-based comb generators[17], as well as gain-switched[18] or mode-locked lasers[19]. These schemes, however, provide only restricted numbers of carriers, and the highest data rate demonstrated with such chip-scale comb sources[19] so far amounts to 2.3 Tbit/s. Transmission at higher data rates[7,13-15,20], still relies on spectral broadening of narrowband seed combs using dedicated optical fibers[7,13-15] or nanophotonic waveguides[20] with high Kerr nonlinearities. However, to generate uniform comb spectra with broadband spectral envelopes, these schemes often rely on delicate dispersion management schemes, often in combination with intermediate amplifiers.[14] Such schemes are difficult to miniaturize and not amenable to chip-scale integration. Moreover, with a few exceptions at comparatively low data rates[21], all advanced comb-based transmission experiments still rely on conventional continuous-wave lasers as optical local oscillators (LO) for coherent detection. As a consequence, these concepts exploit the scalability advantages of frequency combs for massively parallel optical communications only at the transmitter, but not at the receiver side.

Dissipative Kerr solitons (DKS)[3] generated in photonic chip based micro-resonators can overcome these limitations. In general, Kerr comb sources[22-26] offer unique advantages such as small footprint, large number of optical carriers with narrow optical linewidths, and line spacings of tens of GHz, which can be designed to fit established WDM frequency grids. Moreover, the approach allows to leverage the tremendous advances in silicon photonic integration, enabling advanced multiplexer circuits[8], on-chip detectors[27], modulators[28], and lasers[29,30]. Using low-noise Kerr combs, coherent data transmission was demonstrated previously[31], but the aggregate line rate was limited to 1.44 Tbit/s due to strong irregularities of the optical spectrum associated with the specific comb states. This restricted the number of usable WDM carriers and led to relatively low optical powers, such that rather simple quadrature phase-shift keying (QPSK) had to be used as a modulation format.

Using in particular micro-resonator soliton Kerr frequency combs can overcome these limitations of conventional Kerr comb sources, thereby unlocking the tremendous potential of Kerr comb sources for massively parallel high-speed data transmission[32]. Dissipative Kerr soliton (DKS) comb states are distinct from previously studied Kerr combs in that their waveform corresponds to continuously circulating optical pulses in the time domain that lead to extraordinarily smooth and broadband spectral envelopes. Theoretically predicted in Refs. 33 and 34, DKS have been observed in a different types of micro-resonators including silica-on-silicon[35], silicon nitride[4] ($Si_3N_4$) as well as crystalline $MgF_2$ devices[3].

In Ref 32, integrated $Si_3N_4$ micro-ring resonators have been used to perform a series of proof-of-concept demonstrations that exploit the extraordinarily smooth and broadband spectral envelope and the inherently low phase noise of soliton Kerr combs. The devices feature free spectral ranges of approximately 100 GHz and intrinsic Q-factors of approximately $10^6$. The $Si_3N_4$ platform was chosen because of its remarkable reliability and its compatibility with large-scale silicon-based processing[23]. According to Ref. 32, data have been transmitted on 94 carriers that span the entire telecommunication C and L bands with a free spectral range (FSR) of approximately 100 GHz. Using 16-state quadrature amplitude modulation (16QAM) at a symbol rate of 40 GBd, an aggregate line rate (net data rate) of 30.1 Tbit/s (28.0 Tbit/s) was achieved.

Broadband Kerr comb generation using dissipative Kerr solitons in high-Q silicon nitride micro-resonators is illustrated in FIG. 1. Kerr comb sources rely on parametric frequency conversion in high-Q micro-resonators, which are pumped by a continuous-wave (cw) laser[22,25]. The principle of comb generation is shown in FIG. 1A: The micro-resonator is driven by a tunable cw-laser and a high-power erbium-doped fiber amplifier (EDFA). After the micro-resonator, a notch filter (NF) supresses the remaining pump light. Lensed fibers are used to couple light in and out of the on-chip waveguides. A fiber polarization controller (FPC) is adjusted for maximum coupling into the resonance. The insets show the scanning electron microscopy (SEM) images of a dispersion optimized $Si_3N_4$ micro-resonator with radius 240 μm. Right inset shows the whole resonator. Left insets show the cross sections of the ring resonator's waveguide (dimensions 0.8×1.65 μm$^2$) at the coupling point (upper inset) and at the tapered section (lower inset, dimensions 0.8×0.6 μm$^2$). The tapered section is responsible of filtering higher order modes families[43] while preserving a high quality factor (Q~$10^6$) for the two fundamental modes $TE_{00}$ and $TM_{00}$.

FIG. 1B shows the power spectra and time-domain representation of different low-noise Kerr frequency comb states: Single-soliton Kerr combs (top) exhibit a short soliton pulse circulating inside the cavity. This leads to a broadband comb spectrum with smooth envelope that is perfectly suited for high-speed data transmission. Such comb states are obtained for pump wavelengths above the thermally shifted resonance wavelength of the cavity ("effective red detuning"). In contrast to that, Kerr com generators of previous transmission experiments (bottom) were operated with and effectively blue detuned pump, leading to a periodic waveform which does not exhibit any discrete pulses in the time domain. The corresponding spectra exhibit substantial variations of the power distribution, thereby limiting performance of the associated data transmission schemes.

According to FIG. 1C, the measured spectrum of a single-soliton frequency comb shows that the frequency comb presents a smooth envelope with a 3 dB bandwidth of 6 THz with hundreds of carriers which cover in excess both C and L telecommunication bands, highlighted in red and blue respectively.

Dissipative Kerr solitons represent a particularly attractive subset of Kerr comb states. They appear as specific solutions of the Lugiato-Lefever equation[37] and consist of an integer number of discrete secant-hyperbolic shaped pulses circulating in the cavity[3]. DKS rely on the double balance of dispersion and Kerr nonlinearity, as well as of parametric gain and cavity loss. The number of solitons in the cavity can be adjusted by fine-tuning of the pump wavelength[3,38].

Of particular interest are the single-soliton combs states, which consist of only one ultra-short pulse circulating around the cavity, leading to a broadband comb spectrum with smooth numerically predictable[3] envelope, see upper panel of FIG. 1B. The measured power spectrum of the DKS comb state is shown in FIG. 1C, obtained at the output of the notch filter (NF) of FIG. 1A. This is in sharp contrast to conventional Kerr frequency combs for which the intra-cavity waveform corresponds to a periodic pattern, which does not exhibit any discrete pulses, see lower panel of FIG. 1B. The spectra of these patterns also consist of discrete equidistant lines, but exhibit substantial variations of the spectral power distribution, which severely limits the number of carriers that can be used for WDM transmission[31].

DKS frequency combs can be generated by operating the resonator in the effectively red-detuned regime with respect to the cavity resonance, where the pump wavelength is bigger than the wavelength of the thermally shifted resonance[3]. This regime can be accessed by fast sweeping of the pump laser through the cavity resonance from a blue-detuned wavelength to a predefined red-detuned wavelength[3,4]. Importantly, once a multiple-soliton comb state is generated, the transition to a single-soliton state can be accomplished in a reliable and deterministic manner as recently reported[38]. The soliton comb states are remarkably robust and remain stable for many hours in a laboratory environment without requiring any feedback control mechanisms[39].

DKS frequency comb based signal processing still may have limitations in terms of achievable data rate and/or device and processing complexity on the receiver side.

Objective of the Invention

The objective of the invention is to provide an improved signal processing apparatus avoiding limitations of conventional techniques. Furthermore, the objectives of the invention are to provide an improved transmitter apparatus and an improved receiver apparatus being configured for a signal processing system, avoiding limitations of conventional techniques. Furthermore, the objectives of the invention are to provide improved methods of transmitting and receiving coherent parallel optical signals, avoiding limitations of conventional techniques. In particular, the signal processing is to be improved in terms of achievable data rate and/or device and processing complexity on the receiver side.

SUMMARY OF THE INVENTION

These objectives are solved by the signal processing apparatus, the transmitter apparatus, the receiver apparatus, the signal processing method, the transmitting method, and the receiving method comprising the features of the independent claims. Preferred embodiments of the invention are defined in the dependent claims.

According to a first general aspect of the invention, the above objective is solved by a signal processing apparatus (signal processing system) for transmitting and receiving coherent parallel optical signals, comprising a transmitter apparatus including a first single soliton micro-resonator device and a modulator device, wherein the first single soliton micro-resonator device is adapted for creating a single soliton providing a first frequency comb, which provides a plurality of equidistant optical carriers (WDM carriers) with a frequency spacing corresponding to a free spectral range of the first single soliton micro-resonator device, and the modulator device is adapted for modulating the optical carriers according to data to be transmitted. Furthermore, the signal processing apparatus comprises a receiver apparatus including a coherent receiver device with a plurality of coherent receivers and a local oscillator device providing a plurality of reference optical signals, wherein the coherent receiver device and the local oscillator device are arranged for coherently detecting the transmitted modulated optical carriers. The transmitter apparatus and the receiver apparatus are coupled via an optical communication channel, e. g. a fiber optical connection.

According to the invention, the signal processing apparatus further includes at least one further (at least one second) single soliton micro-resonator device having a free spectral range being equal or approximated to the free spectral range of the first single soliton micro-resonator device and being adapted for creating at least one single soliton providing at least one further (at least one second) frequency comb, wherein the at least one second frequency comb provides at least one of additional optical carriers and the reference optical signals. Accordingly, the invention provides at least one of the following advantages. Firstly, the data rate of transmission can be essentially increased by the additional optical carriers. Additionally or alternatively, the creation of the reference optical signals is essentially simplified, thus reducing the complexity on the receiver side.

According to a second general aspect of the invention, the above objective is solved by the transmitter apparatus for transmitting coherent parallel optical signals, in particular in the signal processing apparatus of the above first general aspect of the invention.

According to a third general aspect of the invention, the above objective is solved by the receiver apparatus for receiving coherent parallel optical signals, in particular in the signal processing apparatus of the above first general aspect of the invention.

According to a fourth general aspect of the invention, the above objective is solved by a signal processing method, including transmitting and receiving coherent parallel optical signals, using a transmitter apparatus with a first single soliton micro-resonator device and a receiver apparatus with a coherent receiver device having a plurality of coherent receivers and a local oscillator device providing a plurality of reference optical signals. The signal processing method comprises the steps of creating a single soliton with the first single soliton micro-resonator device, the single soliton providing a first frequency comb, wherein the first frequency comb provides a plurality of equidistant optical carriers with a frequency spacing corresponding to a free spectral range of the first single soliton micro-resonator device, and modulating the optical carriers according to data to be transmitted. Furthermore, the signal processing method comprises the steps of coherently detecting the transmitted modulated optical carriers with the coherent receiver device and the local oscillator device According to the invention, the signal processing method further includes a step of creating at least one further (at least one second) frequency comb providing at least one of additional optical carriers and the reference optical signals, the at least one further (at least one second) frequency comb being created with at least one second single soliton micro-resonator device having a free spectral range being equal or approximated to the free spectral range of the first single soliton micro-resonator device and being adapted for creating at least one single soliton providing the at least one second frequency comb. Preferably, the signal processing method is conducted using the signal processing apparatus of the above first general aspect of the invention.

According to a fifth general aspect of the invention, the above objective is solved by a transmitting method for transmitting coherent parallel optical signals, in particular in a signal processing method of the above fourth general aspect of the invention.

According to a sixth general aspect of the invention, the above objective is solved by a receiving method for receiving coherent parallel optical signals in a signal processing method of the above fourth general aspect of the invention.

The following features described with reference to the signal processing apparatus or methods and the transmitter and receiver components thereof can be implemented in the transmitter apparatus according to the second general aspect of the invention, in the receiver apparatus according to the third general aspect of the invention, the transmitting method according to the fifth general aspect of the invention, or the receiving method according to the sixth general aspect of the invention.

The first or further single soliton micro-resonator device (or: dissipative Kerr soliton micro-resonator device) used according to the invention includes any type of optical micro-resonator, in particular micro-resonator with a closed beam path, like micro-ring resonators, or linear micro-resonators, having a sub-cm, in particular sub-mm scale optical path length of the closed beam path or between the resonator mirrors (e. g. optical path length equal to or below 1 cm, in particular below 1 mm) and a sub-mm scale optical mode field diameter (e. g. optical mode field diameter equal to or below 100 µm).

Preferably, at least one of the optical micro-resonators, in particular each optical micro-resonator, is composed by a continuous wave pumped silicon nitride waveguide and resonator, embedded with silica on a silicon chip.

The single soliton micro-resonator device is adapted for creating single soliton pulses. The single soliton micro-resonator device can be provided as described in reference 50. Preferably, the single soliton micro-resonator devices includes a continuous wave (cw) laser arranged for providing cw laser light, and the optical micro-resonator comprising a resonator material, which has a third order (Kerr)

nonlinearity and an anomalous resonator dispersion, wherein the cw laser is arranged for coupling the cw laser light into the optical micro-resonator. With more details, the single soliton micro-resonator device may include a continuous wave (cw) laser arranged for providing cw laser light, the optical micro-resonator comprising a resonator material, which has a third order (Kerr) nonlinearity and an anomalous resonator dispersion, wherein the cw laser is arranged for coupling the cw laser light into the optical micro-resonator, which, at a predetermined relative detuning of the cw laser and the optical micro-resonator, is capable of including a light field in a soliton state, wherein soliton shaped pulses can be coupled out of the optical micro-resonator for providing the frequency comb, and a tuning device arranged for creating and maintaining the predetermined relative detuning of the cw laser and the optical micro-resonator based on a tuning time profile selected in dependency on a thermal time constant of the optical micro-resonator such that the soliton state is achieved in a thermal equilibrium state of the optical micro-resonator.

The soliton comb states are remarkably robust and remain stable for many hours in a laboratory environment without requiring any feedback control mechanisms[39]. This enables advanced transmission experiments that rely, e.g., on interleaving of two frequency combs to increase spectral efficiency. To this end, the inventors used two independent micro-resonators with practically identical free spectral ranges (FSR), and exploited thermal tuning to offset one of the combs by half the FSR with respect to the other.

According to a preferred embodiment of the invention, the signal processing apparatus includes a frequency tuning device being adapted for adjusting a central frequency of the first and/or second (or further) frequency combs and/or the free spectral ranges of the first and/or second (or further) single soliton micro-resonator devices. Preferably, a spectrum measurement unit is provided for detecting spectral properties, in particular frequency components, of the first and second frequency combs, and the frequency tuning device is adapted for matching the free spectral ranges of the first and second single soliton micro-resonator devices and/or adjusting the central frequencies of the first and second frequency combs using acquired data from the spectrum measurement unit.

According to a preferred embodiment of the invention, the frequency tuning device comprises at least one temperature setting device, like e. g. a resistance heater being adapted for adjusting a temperature of the first and/or the second single soliton micro-resonator devices.

If the central frequencies of the first and/or second frequency combs are adjusted using an absolute optical wavelength reference and/or the free spectral ranges of the first and/or second single soliton micro-resonator devices are adjusted using an absolute RF wavelength reference, advantages for a control of the coherent parallel optical signals with reference to absolute measures is obtained.

According to a further preferred embodiment of the invention (in the following: first embodiment), the second single soliton micro-resonator device is arranged at the transmitter apparatus for creating the second frequency comb providing the additional optical carriers. Furthermore, the transmitter apparatus includes a coupling device, like a directional fiber coupler, being arranged for interleaving (or: interlacing) the optical carriers of the first and second frequency combs. Advantageously, the specific feature of single solitons having well separated frequency components, can be employed for obtaining an increased density of optical carriers in the frequency interval of interest.

Preferably, the frequency tuning device comprises a transmitter tuning device for adjusting a central frequency of the first and/or second frequency combs and/or the free spectral ranges of the first and/or second single soliton micro-resonator devices, such that a mutual frequency offset of the first and second frequency combs is equal or approximated to a half free spectral range of the first single soliton micro-resonator device.

According to a further preferred feature of the invention, the coupling device is arranged upstream of the modulator device, in particular between the first and second single soliton micro-resonator devices and the modulator device.

The first embodiment of using interleaved single soliton frequency combs is not restricted to the provision of two single soliton micro-resonator device at the transmitter side. Alternatively, a third or even further single soliton micro-resonator device(s) can be arranged at the transmitter apparatus, having a free spectral range being equal or approximated to the free spectral range of the first and second single soliton micro-resonator devices and being adapted for creating at least one single soliton providing a third or further frequency comb(s). Advantageously, the third or further frequency comb(s) provides additional optical carriers, thus further increasing the data rate to be submitted. The full group of coherent parallel optical signals is obtained by interleaving the optical carriers of the first, second and at least one third frequency combs.

According to a further preferred embodiment of the invention (in the following: second embodiment), the second single soliton micro-resonator device is arranged at the receiver apparatus for creating the second frequency comb providing the reference optical signals. Advantageously, this feature results in a reduced complexity on the receiver side and a facilitated parallel detection of the transmitted coherent parallel optical signals.

Preferably, the frequency tuning device comprises a receiver tuning device for adjusting a central frequency of the first and/or second frequency combs and/or the free spectral ranges of the first and/or second single soliton micro-resonator devices, such that the central frequencies of the first and second frequency combs are equal or approximated to each other. Advantageously, the receiver tuning device is adapted for adjusting the central frequency of the second frequency comb in dependency on feedback signals from the coherent receiver apparatus.

The second embodiment is not restricted to the provision of one single soliton micro-resonator at the receiver side. Alternatively, a third or further single soliton micro-resonator device(s) can be arranged at the receiver apparatus, having a free spectral range being equal or approximated to the free spectral range of the first and second single soliton micro-resonator devices and being adapted for creating at least one single soliton providing a third or further frequency comb(s), wherein the third or further frequency comb(s) provide additional reference optical signals. Preferably, a coupling device is arranged for interleaving the reference optical signals of the second and at least one third frequency combs.

According to a particularly preferred embodiment of the invention (in the following: third embodiment of the invention), at least one additional single soliton micro-resonator device is arranged at the transmitter apparatus for creating the at least one additional frequency comb providing the additional optical carriers and the transmitter apparatus includes a coupling device being arranged for interleaving the optical carriers of the first and second frequency combs, and at least one further single soliton micro-resonator device is arranged at the receiver apparatus for creating a single soliton providing at least one frequency comb, wherein this at least one frequency comb provides the reference optical signals.

In summary, according to the first embodiment of the invention, at least two interleaved Kerr combs are used to transmit data on a total of e. g. 179 individual optical carriers that preferably span the entire telecommunication C and L bands. Using higher-order modulation formats (16-state quadrature amplitude modulation, 16QAM), net data rates exceeding 50 Tbit/s are attained, the highest value achieved with a chip-scale frequency comb source to date. Equally important, coherent detection of a WDM data stream by using at least one second Kerr soliton comb as a multi-wavelength local oscillator (LO) at the receiver is disclosed according to the second embodiment of the invention. As a consequence, the micro-resonator soliton based sources exploit the scalability advantages for massively parallel optical communications at both the transmitter and the receiver side, contrasting commonly employed continuous-wave lasers as optical local oscillators (LO) for detection.

Taken together the results prove the tremendous technological potential of photonic chip based micro-resonator soliton comb sources in high-speed communications. In combination with advanced spatial multiplexing schemes[5-7] and highly integrated silicon photonic circuits[8], micro-resonator soliton combs may bring chip-scale petabit/s transceiver systems into reach, that are of significant interest to cope with the massively increasing datarates within and between large-scale data-centers.

BRIEF DESCRIPTION OF THE DRAWINGS

Further advantages and details of the preferred embodiments of the invention are described in the following with reference to the attached drawings, which show in:

FIG. 2: a schematic illustration of coherent data transmission using dissipative Kerr soliton frequency comb generators as optical sources for massively parallel wavelength-division multiplexing, wherein FIGS. 2A and 2B illustrate conventional techniques and FIGS. 2C to 2G illustrate a first embodiment of the invention;

FEATURES OF PREFERRED EMBODIMENTS OF THE INVENTION

Preferred features of embodiments of the invention are described in the following with exemplary reference to two implementations, which are indicated as first and second embodiments. The invention is not restricted to these embodiments, but rather can be realized with alternative variants, including features as generally described above, in particular features of both embodiments, e.g. as shown in the general schemes of FIG. 8. In particular, the optical components and monitoring components of the illustrated embodiments represent examples only, which can be replaced by other components fulfilling the respective functions or omitted.

With the present embodiments of the invention, integrated $Si_3N_4$ micro-ring resonators are used to perform a series of proof-of-concept demonstrations that exploit the extraordinarily smooth and broadband spectral envelope and the inherently low phase noise of soliton Kerr combs. The devices feature free spectral ranges of approximately 100 GHz and intrinsic Q-factors of approximately $10^6$. The $Si_3N_4$ micro-ring resonators were fabricated using the recently developed photonic Damascene process[42]. Resonators have a nominal waveguide height of 0.8 μm and a width of 1.65 μm. A mode-filtering section was incorporated into the micro-rings in order to suppress higher-order modes. This allows to minimize the number of avoided mode crossings and facilitates soliton comb generation[43]. Implementing the invention is not restricted to the use of integrated $Si_3N_4$ micro-ring resonators with the above specific features, but rather possible with other types of micro-resonators.

First Embodiment of the Invention

According to the illustrated first embodiment of the invention (see FIGS. 2, 4, 5, 7 and 8), two interleaved soliton Kerr combs are used to generate a total of 179 optical carriers in the C and L band, resulting in a carrier spacing of approximately 50 GHz. Using a combination of 16QAM and QPSK, an aggregate line rate (net data rate) of 55.0 Tbit/s (50.2 Tbit/s) is achieved, which is transmitted over a distance of e. g. 75 km. This is the highest data rate achieved to date with a chip-scale frequency comb source and it compares very well to the highest capacity of 97.7 Tbit/s hitherto transmitted through a single-mode fiber core[7]. Optical carriers derived from the soliton Kerr comb do not exhibit implementation penalty compared to carriers derived from a conventional high-quality external cavity laser (ECL).

Figure 2:
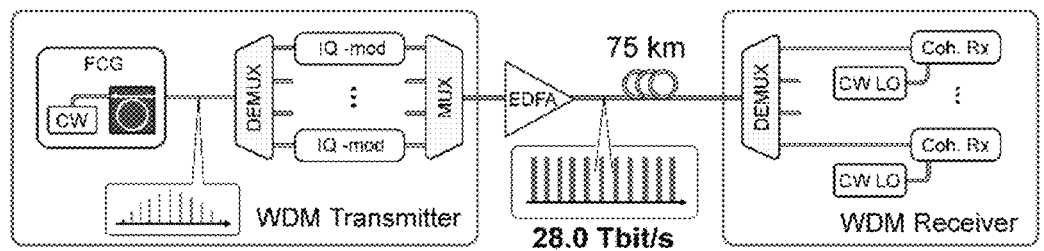
Figure 2:
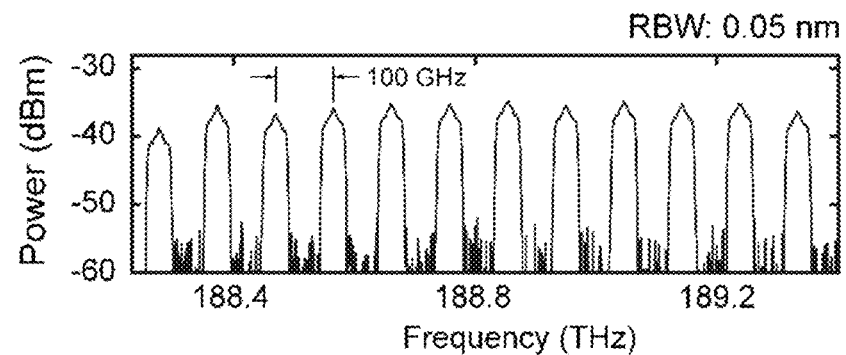
Figure 2:
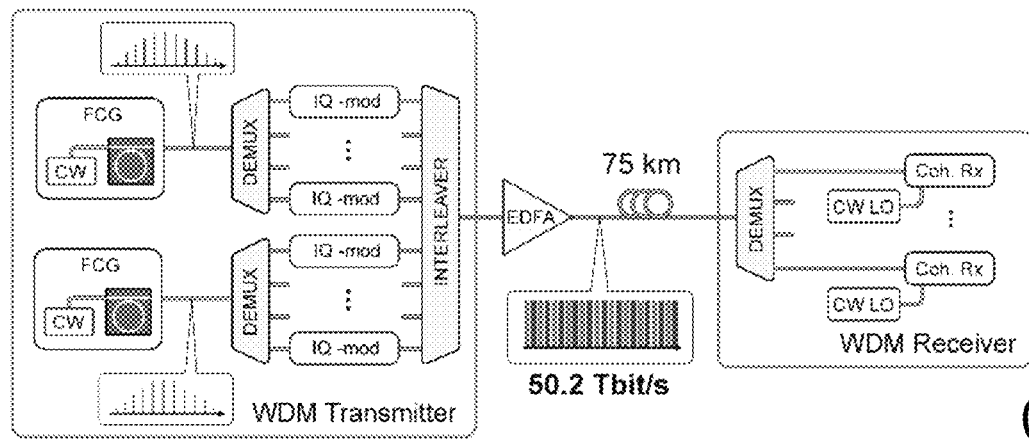
Figure 2:
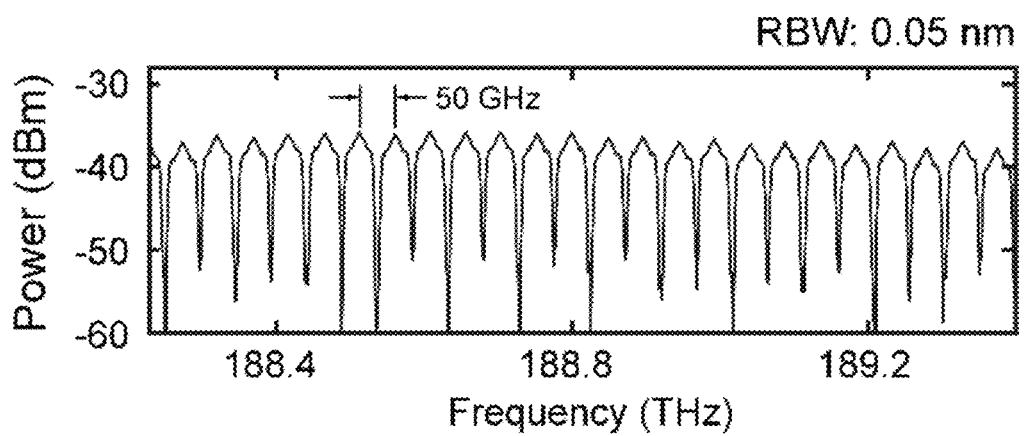
Figure 2:
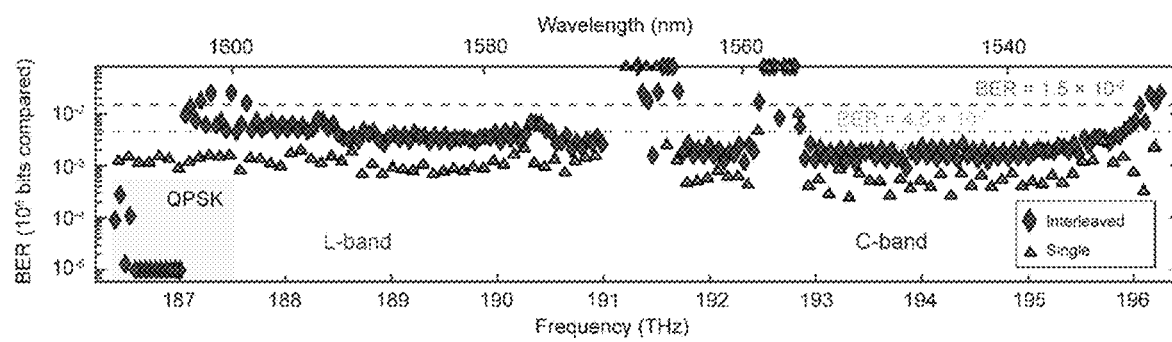
Figure 2:
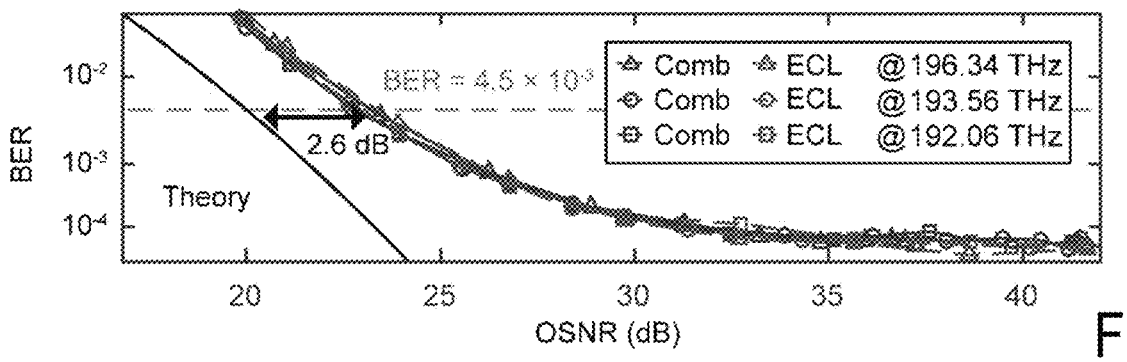
Figure 2:
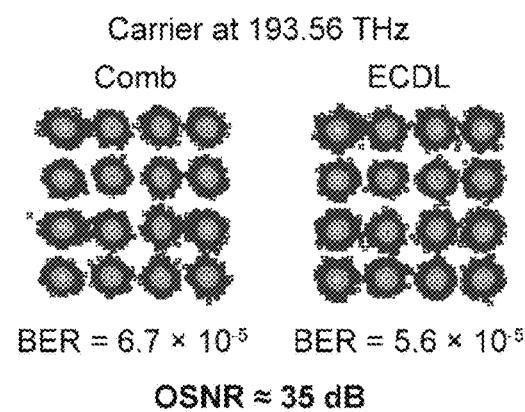

FIG. 2 illustrates the data transmission using dissipative Kerr soliton (DKS) frequency comb generators as optical sources for massively parallel wavelength-division multiplexing (WDM).

FIG. 2A shows the principle of data transmission using a single DKS comb generator as optical source at the transmitter. A demultiplexer (DEMUX) separates the comb lines and routes them to individual dual-polarization in-phase/quadrature (IQ) modulators, which encode independent data streams on each polarization using both the amplitude and the phase of the optical signal as carrier of information. The data channels are detected using digital coherent receivers (Coh. Rx) along with individual cw lasers as local oscillators (CW LO). In the experiment, WDM transmission is emulated by independent modulation of even and odd carriers using two IQ modulators, see description of FIG. 5 for more details. 16-state quadrature amplitude modulation (16QAM) is used at a symbol rate of 40 GBd per channel, leading to an aggregate line rate (net data rate) of 30.1 Tbit/s (28.0 Tbit/s). Although FIG. 2A relates to prior art, the disclosed features can be implemented with the inventive signal processing apparatus or method.

FIG. 2B shows a section of the optical spectrum of the WDM data stream. Nyquist pulse-shaping leads to approximately 40 GHz wide rectangular power spectra for each channel, spaced by the FSR of the comb source of approximately 100 GHz.

FIG. 2C shows the inventive principle of data transmission using interleaved DKS combs. The scheme relies on a pair of combs of identical FSR, which are shifted with respect to each other in frequency by half the FSR. At the receiver, this scheme still relies on individual cw lasers as LO for coherent detection. A simplified scheme for emulation of WDM transmission is used, see description of FIG. 5 for more details.

FIG. 2D shows a section of the optical spectrum of the WDM data stream. The interleaved combs feature a carrier separation of approximately 50 GHz, which, in combination with a symbol rate of 40 GBd and with band-limited Nyquist pulse shaping, enables dense packing of data channels in the spectrum leading to high spectral efficiency and to an aggregate line rate (net data rate) of 55.0 Tbit/s (50.2 Tbit/s).

FIG. 2E shows a measured bit-error ratios (BER) of the transmitted channels for the single-comb technique and the interleaved-comb embodiment, along with BER thresholds for second-generation hard-decision forward-error-correction (FEC) with 7% overhead ($4.5 \times 10^{-3}$, dashed lower line) and for soft decision FEC with 20% overhead ($1.5 \times 10^{-2}$, dashed upper line). For the single-comb experiment, a total of 92 carriers are below the $4.5 \times 10^{-3}$ limit, and two additional carriers show a BER below $1.5 \times 10^{-3}$. For the interleaved-comb embodiment, out of the 179 carriers transmitting data, a total of 165 were operated with 40 GBd 16QAM signals. Out of those carriers, 126 channels show a BER below $4.5 \times 10^{-3}$ and 39 additional are below $1.5 \times 10^{-3}$. For the outer 14 lines at the low-frequency edge of the L band, QPSK signalling was used rather than 16QAM due to the low optical signal-to-noise ratio (OSNR) of these carriers.

FIG. 2F shows measured BER vs. OSNR of three different channels derived from a DKS frequency comb (dark) and a high-quality ECL (bright), all with 16QAM signalling. A total of $10^6$ bits were compared. At a BER of $4.5 \times 10^{-3}$, both sources exhibit the same OSNR penalty of 2.6 dB with respect to the theoretical OSNR (black line). No additional OSNR penalty is observed for the frequency comb lines.

FIG. 2F shows constellation diagrams obtained for an ECL and DKS comb tone at 193.56 THz.

With more details, the concept of massively parallel data transmission using a frequency comb as a multi-wavelength light source is depicted in FIG. 2A. A demultiplexer (DE-MUX) separates the comb lines and routes them to individual dual-polarization in-phase/quadrature modulators (IQ-mod), which encode independent data streams on each polarization using both the amplitude and the phase of the optical signal as carrier of information. The data channels are then recombined into a single-mode fiber using a multiplexer (MUX), boosted by an erbium-doped fiber amplifier (EDFA), and transmitted. At the receiver, the wavelength channels are separated by a second DEMUX and detected with digital coherent receivers (Coh. Rx) using individual cw lasers as local oscillators (CW LO). For a realistic emulation of massively parallel WDM transmission in a lab experiment, the scheme can be simplified using only two IQ-modulators to encode independent data streams on neighbouring channels along with an emulation of polarization division multiplexing (PDM), see description of FIG. 5 for more details of the practical setup and of the signal processing techniques.

In the transmission experiments, 16QAM is employed at a symbol rate of 40 GBd along with band-limited Nyquist pulses that feature rectangular power spectra, FIG. 2B. At the receiver, each channel is individually characterized using an optical modulation analyzer, which extracts signal quality parameters such as the error-vector magnitude (EVM) or the bit-error ratio (BER). The BER results of the transmission experiment are depicted as red triangles in FIG. 2E, along with different BER thresholds indicated as horizontal dashed lines. For a given forward-error correction scheme, these thresholds define the maximum BER of the raw data channel that can still be corrected to a BER level below $10^{-15}$, which is considered error-free. Out of the 101 carriers derived from the comb in the C and L band, a total of 92 channels performed better than the BER threshold of $4.5 \times 10^{-3}$ for the widely used second-generation forward-error correction (FEC) with 7% overhead. The pump tone at approximately 192.66 THz and two neighbouring carriers could not be used for data transmission due to strong amplified spontaneous emission (ASE) background from the pump EDFA; two more directly adjacent channels exceeded the threshold of $4.5 \times 10^{-3}$, but were still below the BER threshold of $1.5 \times 10^{-2}$ for soft-decision FEC with 20% overhead[40]. Another four channels at the low-frequency end of the C-band are lost due to a mismatch on the transmission band of the C-band filters used to realize the demultiplexer. All these limitations can be avoided as discussed in the description of FIG. 5 below. Taking into account only the channels that were actually used for transmission, a total line rate of 30.1 Tbit/s is obtained, and subtracting FEC overhead, the net data rate amounts to 28.0 Tbit/s.

Note that the wavelength range used for the illustrated transmission embodiment was only limited by the available communication equipment, leaving vast potential for further increasing the channel count, e.g., by using the adjacent S, and U bands for telecommunications in the near infrared. Moreover, the data transmission capacity of the the illustrated transmission embodiment is essentially restricted by the fact that the FSR of approximately 100 GHz is much bigger than the signal bandwidth of, e.g., 40 GHz, which can be achieved with current driver electronics. This leads to considerable unused frequency bands between neighbouring channels, see FIG. 2B, leading to a rather low spectral efficiency (SE) of 2.8 bit/s/Hz in the conventional technique.

These restrictions can be overcome by using interleaved frequency combs according to the invention, see FIG. 2C for a sketch of the associated transmission scheme. The scheme relies on a pair of DKS combs which have practically identical FSR but are shifted with respect to each other in frequency by half the FSR.

Dissipative Kerr soliton comb tuning and interleaving is described in the following. Precise adjustment for interleaving of the frequency combs in the second transmission experiment is achieved by adjusting the temperature of each micro-resonator, which changes the refractive index and thereby shifts the resonance frequencies while leaving the FSR essentially unchanged[46]. The resonance frequencies of the comb can be tuned at a rate of approximately −2.5 GHz/K with an accuracy of approximately 200 MHz, limited by the resolution of the heater. A detailed sketch of the practical setup is given in FIG. 4 and the description thereof. In addition, as a consequence of intra-pulse Raman scattering[47], the center frequency of the comb can also be tuned by slowly changing the pump frequency during operation at a constant external temperature. The associated tuning range is limited to approximately ±500 MHz before the comb state is lost; the tuning resolution is given by the pump laser and amounts to approximately 10 MHz for our devices (TLB-6700, New Focus; TSL-220, Santec). These tuning procedures are used for precise interleaving of DKS combs in the second transmission experiment and for synchronizing the LO comb to the Tx comb in the third transmission experiment.

At the receiver, this scheme still relies on individual cw lasers as local oscillators for coherent detection. In the practical example, a simplified scheme was used for emulation of independent dual-polarization WDM channels, see FIG. 5 and the description thereof for more details. The interleaved combs feature a carrier separation of approximately 50 GHz, which, in combination with a symbol rate of 40 GBd and with band-limited Nyquist pulse shaping, enables dense packing of data channels in the spectrum, see FIG. 2D. The BER results of the transmission experiment are depicted as blue diamonds in FIG. 2E.

Figure 5:
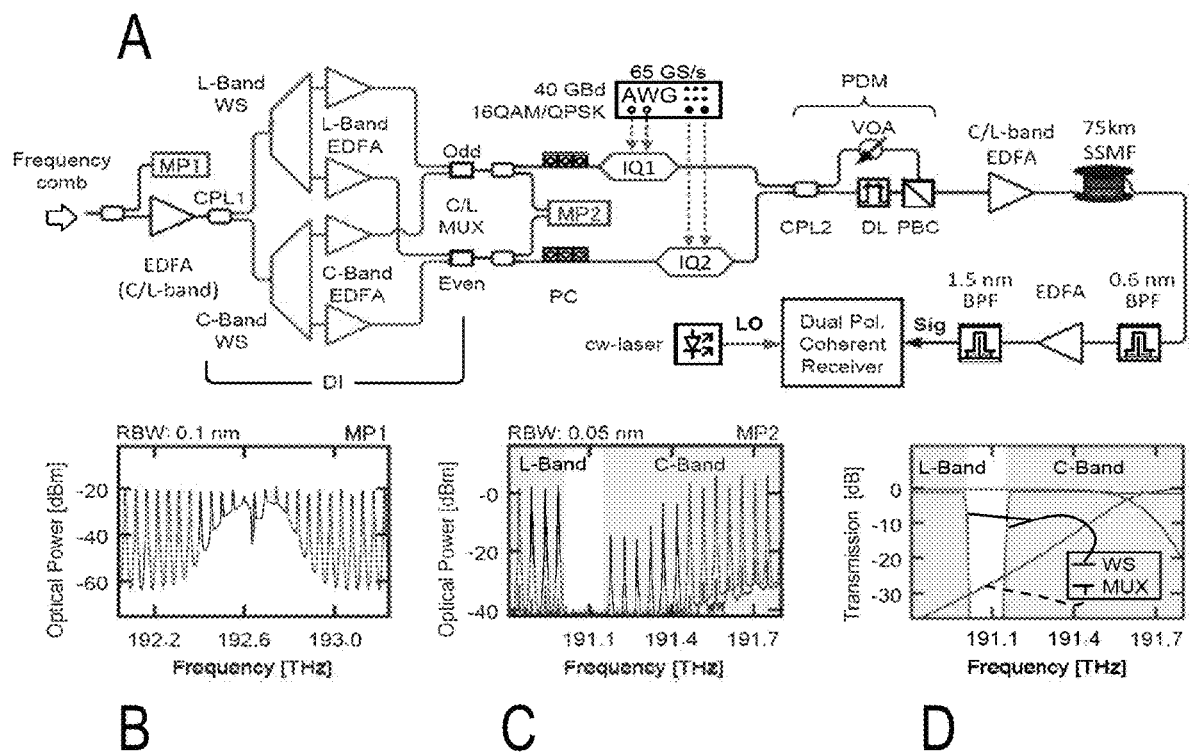
FIG. 5: an illustration of data transmission with interleaved Kerr soliton frequency combs as WDM carriers at the transmitter and signal quality limitations.

In practical example, a total of 204 tones and in the C and L band are found, out of which 179 carriers could be used for data transmission due to technical limitations in the transmission setup, see FIG. 5 and the description thereof for more details. The transmission performance is slightly worse than in the single-comb experiment, since twice the number of carriers had to be amplified by the same EDFA, which were operated at their saturation output power such that the power per data channel reduced accordingly. Nevertheless, data was successfully transmitted over 75 km of SSMF at a symbol rate of 40 GBd using 16QAM. A total of 126 channels exhibit a BER of less than $4.5 \times 10^{-3}$, requiring an FEC overhead of 7%, and 39 additional channels showed a BER below $1.5 \times 10^{-2}$ which can be corrected by FEC schemes with 20% overhead. For the 14 channels at the low-frequency edge of the L band, the modulation format was changed to QPSK since data transmission using 16QAM was inhibited by the low power of these carriers caused by a decrease of amplification of the L-band EDFA in this wavelength range. Overall, a total line rate of 55.0 Tbit/s was transmitted, leading to a net data stream of 50.2 Tbit/s after subtraction of FEC overhead. This value corresponds to the highest data rate so far achieved with a chip-scale frequency comb source, and it compares very well to the highest capacity of 97.7 Tbit/s achieved for a single-mode fiber core to date[7]. In addition, an unprecedented SE of 5.2 bit/s/Hz is achieved, owing to the densely packed spectrum, FIG. 2D.

Note that the limited saturation output power of the employed EDFA is the main constraint of signal quality and BER. The inventors have confirmed experimentally that increasing the output power of the EDFA or distributing the channels over several amplifiers would improve the signal quality considerably, see FIG. 5 and the description thereof for more details. The presented data rates are hence not limited by the comb source, but by the components of the current transmission setup, leaving room for increasing the data rate further.

To further confirm the outstanding potential of DKS combs for data transmission, the transmission performance of a single comb line is compared to that of a high-quality ECL reference carrier having an optical linewidth of approximately 10 kHz. As a metric for the comparison, the optical signal-to-noise ratio (OSNR) penalty at a BER of $4.5 \times 10^{-3}$ is used, which corresponds to the threshold for FEC with 7% overhead. For a given BER, the OSNR penalty is given by the dB-value of the ratio of the actually required OSNR to the OSNR that would be theoretically required in an ideal transmission setup[41]. To determine the OSNR penalty, the FCG and the setup from the comparative example of FIG. 2A, is used, and an individual line is selected out of the frequency comb. This carrier is modulated with a PDM-16QAM signal at 40 GBd. We then replace the 75 km SSMF and the preceding EDFA by a noise-loading stage consisting of an ASE noise source and two variable optical attenuators (VOA), see FIG. 6 and the description thereof for details of the practical setup. The noise-loading stage is used to adjust the OSNR of the channel while keeping its optical power essentially constant. The results are shown in FIG. 2F for three different comb lines (dark) and for ECL reference transmission experiments at the corresponding frequencies (bright). The OSNR values are defined for a reference bandwidth of 0.1 nm. The curves are indistinguishable, i.e., no additional OSNR penalty is observed for the frequency comb when compared with the high-quality ECL, albeit the maximum achievable OSNR in our setup (44 dB at 192.06 THz) is lower than the maximum OSNR achievable with the ECL (58 dB). For both sources, an OSNR penalty of 2.6 dB with respect to the theoretically required OSNR (black line) is observed for a BER=$4.5 \times 10^{-3}$. The error floor is attributed to transmitter nonlinearities and receiver noise in our setup.

FIG. 2G shows the measured constellation diagrams for the ECL and the comb line at 193.56 THz, both taken at the same OSNR of 35 dB. The comb and the ECL perform equally well also at other symbol rates such as 28 GBd, 32 GBd and 42.8 GBd.

Further details of soliton generation are described in the following. The DKS combs are generated by pumping the micro-resonators with an ECL and a subsequent EDFA, which is operated at an output power of approximately 35 dBm, see above and FIG. 7 for a more detailed description of the comb generation setup. A high-power band-pass filter with a 3 dB bandwidth of 0.8 nm is used to suppress the ASE noise from the optical amplifier. The soliton state is excited by well-controlled wavelength tuning[3] of the pump ECL across the resonance at a rate of approximately 100 pm/s.

Once a multiple soliton state is obtained, the transition to a single-soliton state is accomplished by fine-tuning of the pump laser towards lower wavelengths[38]. This slow sweep is performed at a rate of approximately 1 pm/s. Light is coupled in and out of the $Si_3N_4$ micro-resonator by means of lensed fibers with a spot size of 3.5 μm and coupling losses of 1.4 dB per facet. The power coupled to the chip was approximately 32 dBm. The frequency comb used in the single-comb transmission experiment exhibits an FSR of 95.80 GHz and a 3-dB bandwidth of more than 6 THz.

The optical linewidth of individual comb carriers is measured to be approximately 300 kHz, which is perfectly suited for coherent communications[44]. A tunable fiber Bragg grating (FBG) acting as a notch filter at the output of the micro-resonators suppresses the remaining pump to an optical power level that matches the other comb carriers.

Figure 1:
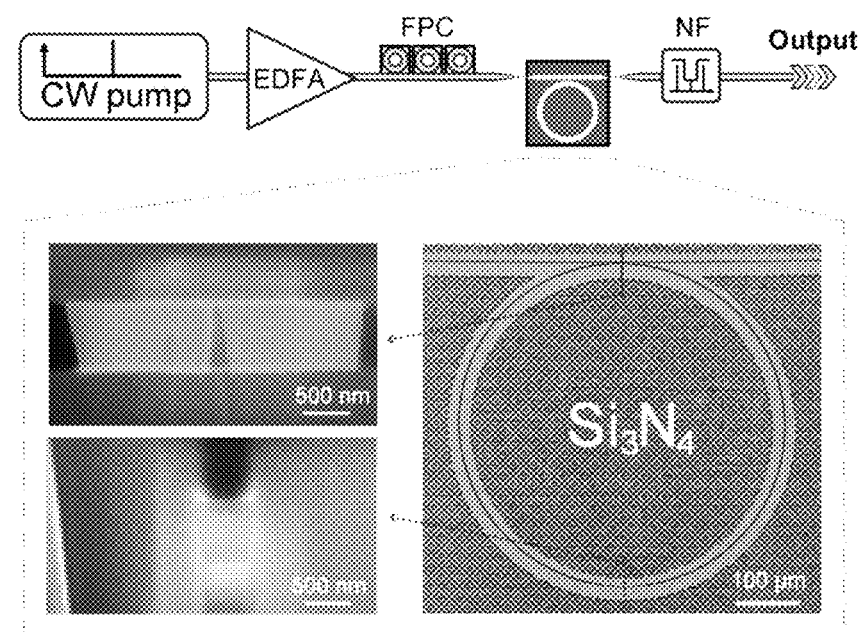
FIG. 1: a schematic illustration of broadband Kerr comb generation using dissipative Kerr solitons in a high-Q silicon nitride micro-resonator.
Figure 1:
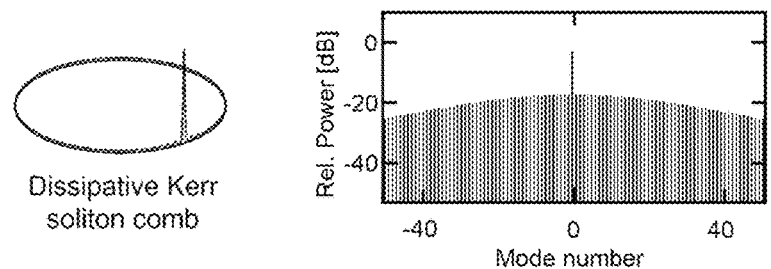
Figure 1:
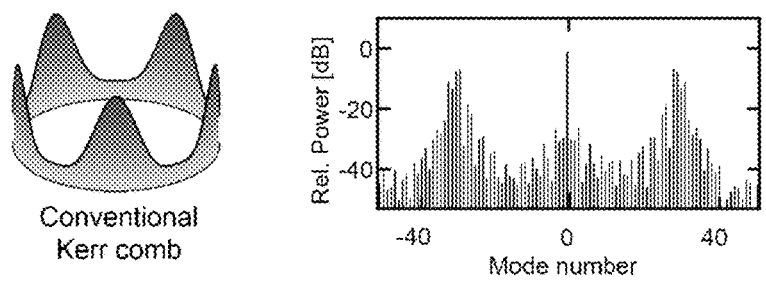
Figure 1:
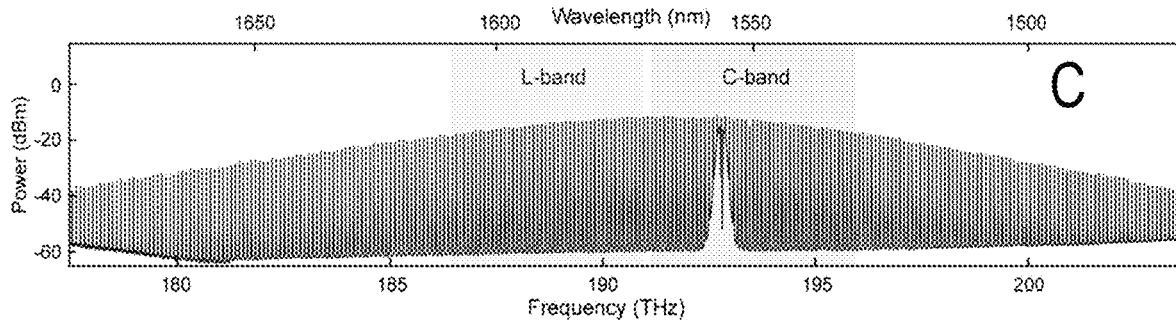

After the FBG, the measured optical power of the entire comb spectrum, see FIG. 1C, amounts to 4 dBm. For the experiments using interleaved transmitter (Tx) frequency combs or a separate receiver (Rx) LO comb, a second DKS comb generator with similar performance is used. The second device for the interleaved Tx combs (for the Rx LO) features a slightly bigger FSR of 95.82 GHz (95.90 GHz) due to fabrication inaccuracies. For the transmission experiments, an EDFA is used to amplify the combs to an approximate power-per-line of 5 dBm prior to modulation. The carriers next to the pumped resonance experience strong amplified stimulated emission (ASE) noise originated from the optical amplifier. In future implementations ASE noise can be avoided by extracting the comb light from the micro-resonator using a drop-port geometry[45]. This would avoid direct transmission of broadband ASE noise through the device and render the notch filter for pump light suppression superfluous.

Further details of the data transmission are described in the following. For data transmission, the single or interleaved frequency comb is amplified to 26.5 dBm by a C/L-band EDFA, before the lines are equalized and dis-interleaved into odd and even carriers to emulate WDM. In the practical example, the de-multiplexer (DEMUX) depicted in FIG. 2A is replaced by two programmable filters (Finisar WaveShaper, WS) along with C- and L-band filters, that act as dis-interleavers to separate the combs into two sets of "even" and "odd" carriers, see FIG. 5 and description thereof for a more detailed description of the experimental setup.

For encoding of independent data streams on the two sets of carriers, two optical IQ modulators are used which are driven with pseudo-random bit sequences of length $2^{11}-1$ at a symbol rate of 40 GBd using QPSK or 16QAM signaling and raised-cosine (RC) pulse shaping with a roll-off factor $\beta=0.1$. The drive signals were generated by arbitrary-waveform generators (AWG). The sampling rate was 65 GSa/s (Keysight M8195A) for the transmission experiment using frequency combs as optical source at the Tx, and 92 GSa/s (Keysight M8196A) for the experiment in which a DKS comb was used as a multi-wavelength LO. In all experiments, PDM is emulated by a split-and-combine method, where the data stream of one polarization is delayed by 238 bits with respect to the other to generate uncorrelated data. The signal is amplified and transmitted over 75 km of SSMF.

At the receiver, each channel can be selected individually by a BPF having a 0.6 nm passband, followed by a C-band or an L-band EDFA, and another BPF with a 1.5 nm passband. The signal is received and processed using an optical modulation analyzer (OMA, Keysight N4391A), using either a high-quality ECL line or a tone of another DKS comb as local oscillator. Offline processing was performed including filtering, frequency offset compensation, clock recovery, polarisation demultiplexing, dispersion compensation, and equalization.

Further details of the characterization of the OSNR penalty of the frequency comb source are described in the following. For comparing the transmission performances of a single comb line to that of a high-quality ECL reference carrier, the OSNR penalty is measured at a BER of $4.5 \times 10^{-3}$. A detailed description of the associated experimental setup is given with reference to FIG. 6 below. The carrier under test is selected by bandpass filtering with a 1.3 nm (160 GHz) wide passband. The carrier is then amplified to 24 dBm by an EDFA (EFDA2 in FIG. 6) and modulated with a PDM-16QAM signal at 40 GBd. Next, an ASE noise source together with two VOA is used to set the OSNR of the channel while keeping its optical power constant. As an ASE generator, a second EDFA (EDFA3 in FIG. 6A) is used. An optical spectrum analyzer (OSA, Ando AQ 6317B) is used for measuring the OSNR at the input of the receiver. For each OSNR value, the quality of the channels is determined by measuring the BER using our previously described receiver configuration of BPF, EDFA, BPF and coherent receiver. At a BER of $4.5 \times 10^{-3}$, a penalty of 2.6 dB with respect to the theoretical OSNR value is observed, see FIG. 2F, which is a common value for technical implementations of optical 16QAM transmitters[48]. For high OSNR, an error floor caused by transmitter nonlinearities and receiver noise is reached. The maximum achievable OSNR of 44 dB at 192.56 Thz for transmission with the comb line is dictated by ASE noise of the C/L-band EDFA (EDFA1) right after the FCG, see FIG. 6. As a reference, the same measurements are repeated using a high quality ECL (Keysight N7714A) to generate the carrier, which leads to essentially the same OSNR penalty for a given BER as the transmission with the comb line. Note that for transmission with the ECL, only one EDFA (EDFA2) is needed to increase the power to 24 dBm before being modulated. As a consequence, a higher maximum OSNR of 58 dB can be achieved with the ECL that with the comb line.

Note that for transmission with a single line, the lowest BER reached at 40 GBd falls below $10^{-4}$, as depicted in FIG. 2F. This value, however, is not reached in the WDM transmission experiment with the full comb, FIG. 2A and FIG. 3D. For WDM transmission, a larger number of carriers are amplified by the EDFA in front of the modulator, which, together with the limited output power of the EDFA, leads to a decrease of the optical power per line and hence of the OCNR. In addition, when interleaving two frequency combs, a VOA and a directional coupler are used to interleave the combs and to adapt the power levels. These components introduce additional loss, which needs to be compensated by the subsequent EDFA. Using additional EDFA would therefore increase the quality of the received signal.

Figure 4:
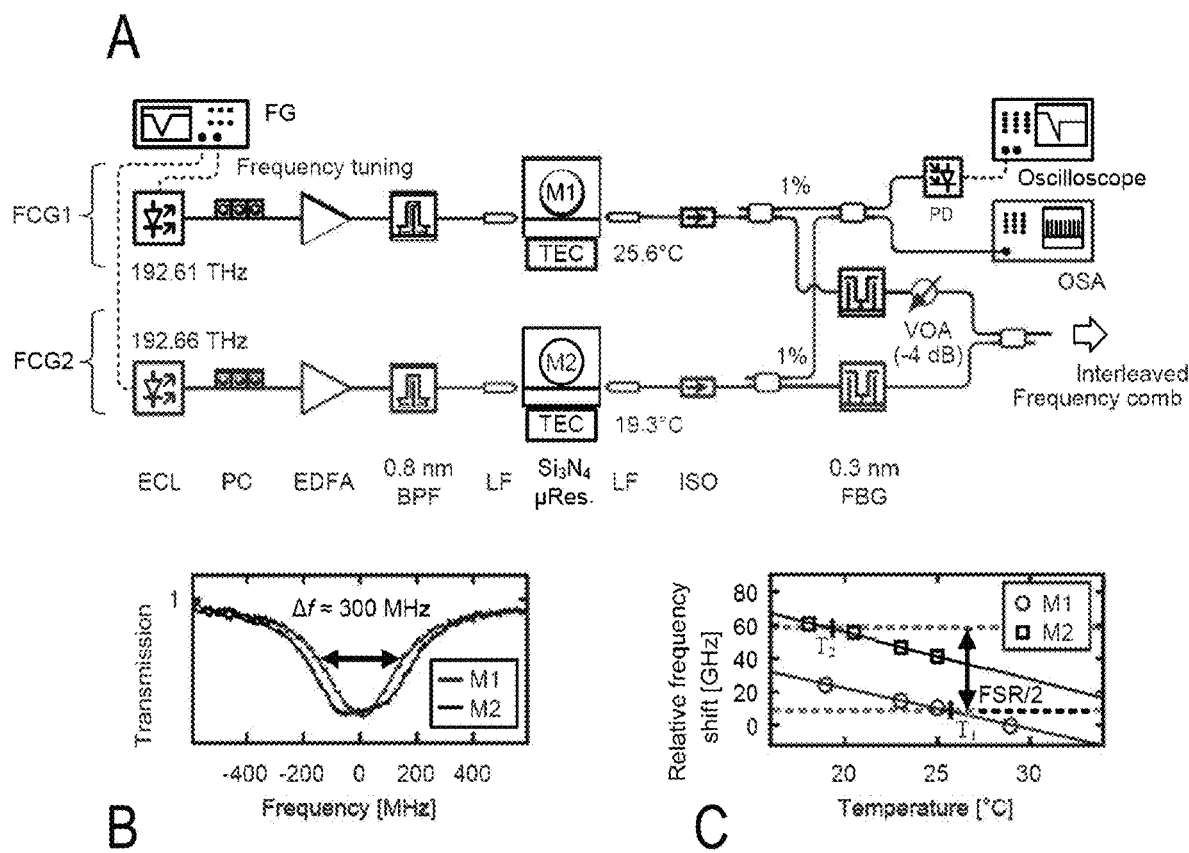
FIG. 4: a schematic illustration of further features of the first or third embodiments of the invention.

FIG. 4 shows further details of Kerr soliton frequency comb generation and interleaving.

FIG. 4A shows a setup for generation of single and interleaved Kerr combs. The frequency comb generator (FCG) for single-comb generation is depicted in black (FCG1); for dual-comb generation and interleaving, a second FCG (FCG2) is used, depicted in brown. The micro-resonators (M1, M2) are driven by a pair of linearly polarized continuous-wave (cw) ECL whose output powers are boosted by erbium-doped fiber amplifiers (EDFA). The frequency of each ECL is controlled via an analogue signal generated by a function generator (FG) for tuning into a soliton state. Amplified spontaneous emission (ASE) noise from the power booster EDFA is suppressed by two band-pass filters (BPF) with 0.8 nm passbands. Light is coupled to and from the chips by lensed fibers (LF) with 3.5 µm of spot size and 1.4 dB of losses per facet, measured at the pump wavelength. After the micro-resonators, isolators (ISO) avoid back reflections into the chip. Fiber Bragg gratings (FBG) acting as notch filters with a 0.3 nm bandwidth are used to attenuate the residual pump light up to a power level comparable to that of the adjacent carriers. Prior to the interleaving of both frequency combs with a directional coupler, a variable optical attenuator (VOA) with 4 dB of attenuation adapts the power level of one comb to the other. A real-time oscilloscope connected to a photodiode (PD) and an optical spectrum analyzer (OSA) are used to track the change of transmitted power and to measure the comb spectrum.

FIG. 4B shows transmitted optical power measured by the PD as a function of the ECL frequencies, around the center frequency of the cold resonances from M1 and M2. A width of about 300 MHz is measured for both micro-resonators, corresponding to a loaded quality factor of approximately $7 \times 10^5$. The different shape of the resonances is attributed to spurious coupling of counter-propagating waves in M2.

FIG. 4C shows a temperature-induced frequency shift of the comb carriers from M1 and M2 relative to the frequencies of the comb carriers from M1 at 28° C. A dependence of −2.2 GHz/K and −2.7 GHz/K is measured for M1 and M2, respectively. Temperatures $T_1=19.3°$ C. and $T_2=25.6°$ C. are chosen for M1 and M2 such that the frequency difference of the carriers near the center of the interleaved comb is half the FSR.

FIG. 4A shows the detailed setup of the dissipative Kerr soliton (DKS) frequency comb generators (FCG) used for the data transmission setup shown in FIG. 2. The DKS frequency comb is generated by pumping a silicon nitride ($Si_3N_4$) micro-resonator with an external cavity laser (ECL). A polarization controller (PC) before the micro-resonator is adjusted for maximum coupling into the resonance. The light from the ECL is amplified by an erbium-doped fiber amplifier (EDFA) which is operated at an output power of approximately 35 dBm. After the EDFA, a high-power band-pass filter (BPF) is used to suppress the amplified stimulated emission (ASE) noise from the optical amplifier. Since the passband of the BPF has finite non-zero width, noise near the pump frequency is not fully suppressed, thereby deteriorating the signal quality of the adjacent carriers. A pair of lensed fibers (LF) with a spot diameter of 3.5 μm couple light into and out of the micro-resonator with 1.4 dB of insertion loss per facet. The temperature of the micro-resonator is adjusted and stabilized by a temperature controller (TEC) while an isolator (ISO) at the output avoids back-reflections into the chip. A fiber Bragg grating (FBG), acting as a notch filter having a 0.3 nm bandwidth, is used to suppress the remaining pump laser up to a level comparable with that of the adjacent frequency comb carriers.

DKS frequency combs are generated by operating the micro-resonator in the effectively red-detuned regime with respect to the cavity resonance, where the pump wavelength is bigger than the wavelength of the thermally shifted resonance. This regime is accessed by fast sweeping of the pump ECL through the cavity resonance from a blue-detuned wavelength to a predefined red-detuned wavelength (forward-tuning) where a multiple-soliton comb state is generated[3,4], see trace I from FIG. 1B. The transition to a single-soliton state is accomplished in a reliable and deterministic manner by adiabatically reducing the wavelength of the pump laser (backward-tuning) thereby approaching the hot cavity resonance from the red side[38,50], see trace II from FIG. 1B. In both sweeps, the ECL wavelength is controlled via an analogue voltage signal generated by a function generator (FG). The forward-tuning is performed at a speed of approximately 100 pm/s and is fast enough to avoid heating the micro-resonator in excess. This prevents loss of the soliton comb state due to an excessive thermal shift of the cavity resonance. The backward-tuning is performed at a speed of approximately 1 pm/s and is slow enough to adiabatically switch between different multiple-soliton states. A real-time oscilloscope and an optical spectrum analyzer (OSA) are used to track the change of transmitted power and to measure the comb spectrum, respectively, while sweeping the pump wavelength along the resonance.

For the interleaved-comb embodiment, FIG. 2C, two DKS comb sources with comparable free spectral ranges (FSR), namely M1 and M2, are used in parallel. The equipment used for the second FCG (FCG2) and for interleaving the soliton Kerr comb of each micro-resonator is marked in brown in FIG. 4A. FCG2 is setup similar to FCG1 as discussed above. The two DKS frequency combs from FCG1 and FCG2 are then superimposed by a directional coupler to obtain the interleaved comb. Note that for the micro-resonator M2, a lower conversion efficiency of optical pump power to soliton power is observed as compared to that of micro-resonator M1. This can be attributed to spurious coupling of counter-propagating waves in M2, which also explains the difference in the shape of the resonances from M1 and M2 depicted in FIG. 4B. Therefore, the power level of the frequency comb from M1 is adapted to that of M2 by a variable optical attenuator (VOA) before interleaving with the directional coupler. This results in a uniform power spectral envelope of the interleaved frequency comb. To obtain an interleaved comb with evenly spaced carriers, the working temperature of each micro-resonator is set such that one of the frequency combs is offset by half an FSR with respect to the other. FIG. 4C shows the frequency shift of the carriers of M1 (red) and M2 (blue), relative to the frequency of the carriers from M1 at 28° C., as a function of the micro-resonator temperature. Both frequency combs follow a linear trend[46] with a shift of −2.2 GHz/K and −2.7 GHz/K for M1 and M2, respectively. Temperatures $T_1$ for M1 and $T_2$ for M2 are chosen such that the frequency difference between the central carriers of both combs is half an FSR, as indicated in FIG. 4C. The pump frequency for the micro-resonator M1 (M2) is set to 192.61 THz (192.66 THz) for the chosen chip temperature of $T_1$=25.6° C. ($T_2$=19.3° C.). At such temperatures, the measured FSR are 95.80 GHZ and 95.82 GHz for M1 and M2, respectively. This results in a difference of approximately 20 MHz, corresponding to about 0.02% of the FSR. Such a small difference in FSR would lead to a variation of the line spacing by ±1 GHz at the edges of the interleaved frequency comb as compared to the line spacing near the center of the comb. Nonetheless, this variation had no significant influence on the received signal quality of the data transmitted using an interleaved frequency comb and can be avoided by carefully matching the FSR of the two combs.

FIG. 5 shows further details of data transmission setups using soliton Kerr combs as optical source at the transmitter.

FIG. 5A illustrates the setup used for massively parallel wavelength division multiplexing (WDM) data transmission. Data transmission setup: the single (interleaved) frequency comb generated by FCG1 (FCG1 and FCG2) from FIG. 4A is amplified by a C/L-band EDFA to a level of approximately 5 dBm (2 dBm) per carrier. Afterwards, WDM is emulated by encoding independent data into neighboring carriers. For doing so, the comb is divided into even and odd carriers by a dis-interleaver (DI) stage. The DI stage contains a directional coupler (CPL1) that divides the optical power into two parts, which are fed to a C-band and an L-band programmable filters (WS).

The WS then splits the input comb lines into even and odd carriers within their respective bands. Each set of carriers is amplified by an EDFA to compensate for the optical losses caused by the dis-interleaving. Next, the C- and L-band carriers from each set are recombined by the use of a C- and L-band multiplexer (C/L MUX) and coupled into two optical IQ modulators (IQ1, IQ2).

The WS are adjusted to compensate the power differences of the carriers and the spectral variations of the EDFA gain profile, thereby producing an overall flat spectrum at the input of IQ1 and IQ2. Both modulators are driven by a high-speed AWG, which is set to generate a PRBS pattern of length $2^{11}-1$ at a symbol rate of 40 GBd and raised-cosine pulse shaping with a roll-off factor of β=0.1. The signal from the AWG is used to modulate the phase and the amplitude of each frequency comb carrier using high order modulation formats such as 16QAM or QPSK.

After combining the modulated signals by a directional coupler (CPL2), PDM is emulated by splitting the data stream into two paths and recombining them on orthogonal polarizations with a decorrelating delay in one path and an attenuator in the other one for maintaining the same power levels. The signal is then amplified and transmitted through a 75 km long standard single mode fiber (SSMF).

At the receiver, a tunable BPF with a 0.6 nm passband selects the channel under test, which is amplified by a C or L-band EDFA, depending on which channels are being investigated. A second BPF (1.5 nm passband) suppresses the ASE noise from the EDFA. Afterwards, the modulated channels are received on a dual-polarization coherent receiver using conventional continuous-wave lasers as optical local oscillators (LO). An optical modulation analyzer (OMA) comprising two real-time oscilloscopes is used to record and process the data signals. Labels MP1 and MP2 represent monitor ports where the spectra shown in FIGS. 5B and 5C, respectively, were recorded. These spectra show impairments of the OCNR which limit the signal quality.

FIG. 5B illustrates the frequency comb spectrum showing the ASE noise coming from the pump EDFA near both pump frequencies.

FIG. 5C illustrates the frequency comb spectrum of the carriers at the gap between the C and L band WS. The low optical power of the carriers at the low frequency edge of the C-band is caused by a mismatch between the C-passbands of the C/L MUX and the WS.

FIG. 5D illustrates transmission profiles of the C- and L-band WS (bright) and of the C-band L-band C/L MUX (dark). For decreasing frequency, the C-band of the C/L MUX shows a decreasing transmission already from 191.7 THz, whereas the transmission band of the C-band WS arrives to 191.2 THz. The carriers within this region are thereby attenuated in optical power.

The single (interleaved) frequency comb generated by FCG1 (FCG1 and FCG2) is amplified by a C/L-band EDFA to a level of approximately 5 dBm (2 dBm) per carrier. For a realistic emulation of massively parallel WDM transmission, neighboring carriers need to be encoded with independent data streams[49]. To this end, the comb is divided into even and odd carriers by a dis-interleaver (DI) stage. The DI stage contains a directional coupler (CPL1) that divides the optical power into two parts, which are fed to a C-band and an L-band programmable filters (Finisar WaveShaper; WS). The WS splits even and odd carriers within the respective band. After the C- and the L-band WS, each set of carriers is amplified by additional EDFA to compensate for optical losses caused during dis-interleaving. Next, the C- and L-band odd carriers are recombined by the use of a C- and L-band multiplexer (C/L MUX), and are coupled into an optical in-phase/quadrature (IQ) modulator (IQ1). The even carriers are also recombined and sent through IQ2. The WS are adjusted to compensate for the power differences of the comb carriers and for the spectral variations of the EDFA gain profile, thereby producing an overall flat spectrum at the inputs of IQ1 and IQ2. Both modulators are driven by a high-speed arbitrary waveform generator (AWG, Keysight M8195A 65 GS/s). The AWG is set to generate a pseudo-random bit sequence (PRBS) of length $2^{11}-1$ at a symbol rate of 40 GBd to encode data on each frequency comb carrier using high order modulation formats such as 16-state quadrature amplitude modulation (16QAM) or quadrature phase shift keying (QPSK). Raised-cosine pulse shaping at a roll-off factor of $\beta=0.1$ is used for improved spectral efficiency.

After modulation, the odd and even channels are combined by a directional coupler (CPL2). Polarization-division multiplexing (PDM) is emulated by splitting the data stream into two paths and recombining them on orthogonal polarizations with a decorrelating delay in one path and an attenuator in the other one for maintaining the same power levels. In our experiment, the decorrelation is implemented by delaying one polarization with respect to the other by approximately 1.5 ns or 238 bit. Therefore, even if both polarizations contain the same PRBS sequence, they are detected as uncorrelated data streams at our coherent receiver. The signal is then amplified and transmitted through 75 km of standard single mode fiber (SSMF).

At the receiver, a tunable BPF with a 0.6 nm passband selects the channel under test. The selected channel is then amplified by a C- or L-band EDFA, depending on which frequency band is being investigated, and is passed through a second 1.5 nm passband BPF to suppress the ASE noise from the EDFA. Afterwards, the channel is received on a dual-polarization coherent receiver which uses a conventional continuous-wave laser as an optical local oscillator (LO).

An optical modulation analyzer (OMA, Keysight N4391A) comprising two real-time oscilloscopes (Keysight DSO-X 93204A, 80 GSa/s) is used to record and process the data signals. The constellation diagram for each channel is obtained after performing signal processing consisting of digital low-pass filtering, polarization demultiplexing, chromatic dispersion compensation, frequency offset estimation, carrier phase estimation, and adaptive equalization. The block length for performing the signal processing is chosen to be 1024 symbols, which is optimized to effectively track the varying physical quantities of the received signal such as the carrier phase and polarization. The extracted bit error ratio (BER) is used as a metric to quantify the signal quality of each channel and it is shown in FIG. 2E of the main paper. Note that for the interleaved comb experiment, the approach of first recombining the unmodulated interleaved combs by means of a directional coupler, FIG. 4A, and then disinterleaving them again by means of the DI stage, FIG. 5A, is used to perform spectral flattening on the unmodulated carriers rather than on the densely packed spectrum of the data signals. Equalizing the data signals would unavoidably have led to distortions due to spectral variations of the attenuation within individual WDM channels.

Limitations on the transmission capacity of our experiments were identified by investigating the spectrum of the interleaved frequency comb at the monitor ports MP1 and MP2 in FIG. 5A. A fraction of the spectrum, measured at MP1 around the frequency of the pump lasers is shown in FIG. 5B. The spectrum depicts a strong residual ASE noise coming from the pump EDFA of FCG1 and FCG2, which passes the relatively wide 0.8 nm BPF centered at the pump frequencies of approximately 192.6 THz. This ASE noise directly deteriorates the optical carrier-to-noise power ratio (OCNR) of the tones adjacent to the pump frequencies, rendering these carriers unusable in the data transmission experiments. FIG. 5C depicts a fraction of the spectrum measured at MP2 and centered at the frequency gap between the C and the L bands near 191.4 THz. The gap originates from the limited bandwidth of the C- and the L-band WS. As can be seen in the figure, there is a strong attenuation of the carriers at the low-frequency edge of the C-band. This is caused by the mismatch between the passbands of the C/L MUX and the passbands of the WS, see FIG. 5D. For decreasing frequency, the C-band of the C/L MUX shows a decreasing transmission starting already at 191.7 THz whereas the C-band WS features a flat transmission band that goes down to 191.2 THz. For the high-frequency edge of the L-band, the passband mismatch does not have any influence because the C/L MUX shows perfect transmission for all frequencies that can pass the L-band WS. All these impairments are not related to the comb sources and can be avoided by using optimized devices and filters with matched passbands. There is considerable room for improving signal quality and further increasing the overall transmission capacity.

In addition, in the data transmission experiments, the limited saturation output power of the employed EDFA is one of the main constraints of signal quality and BER. To quantify the influence of the power per tone on the BER, an extra experiment is performed with less channels but the same spectral efficiency (SE). To this end, the number of L-band channels can be reduced from 97 to 48. These channels were located in the center of the L band, and the number of C-band channels were not changed. In this situation, an average BER of $2.3 \times 10^{-3}$ was obtained for the L-band channels, corresponding to approximately half the averaged BER of $4.7 \times 10^{-3}$ obtained when all L-band carriers were used for transmission.

Note that for the interleaved frequency comb experiment the power per carrier at the input of the first EDFA is reduced compared to the single Kerr soliton comb experiment due to an additional directional coupler for interleaving the combs and due to a variable optical attenuator (VOA) used to adapt the power levels of the two combs, see FIG. 4A. This explains the slightly worse performance in signal quality of the received channels using interleaved frequency combs at the transmitter as compared to the signal quality of the received channels when using a single Kerr soliton comb at the transmitter.

Figure 6:
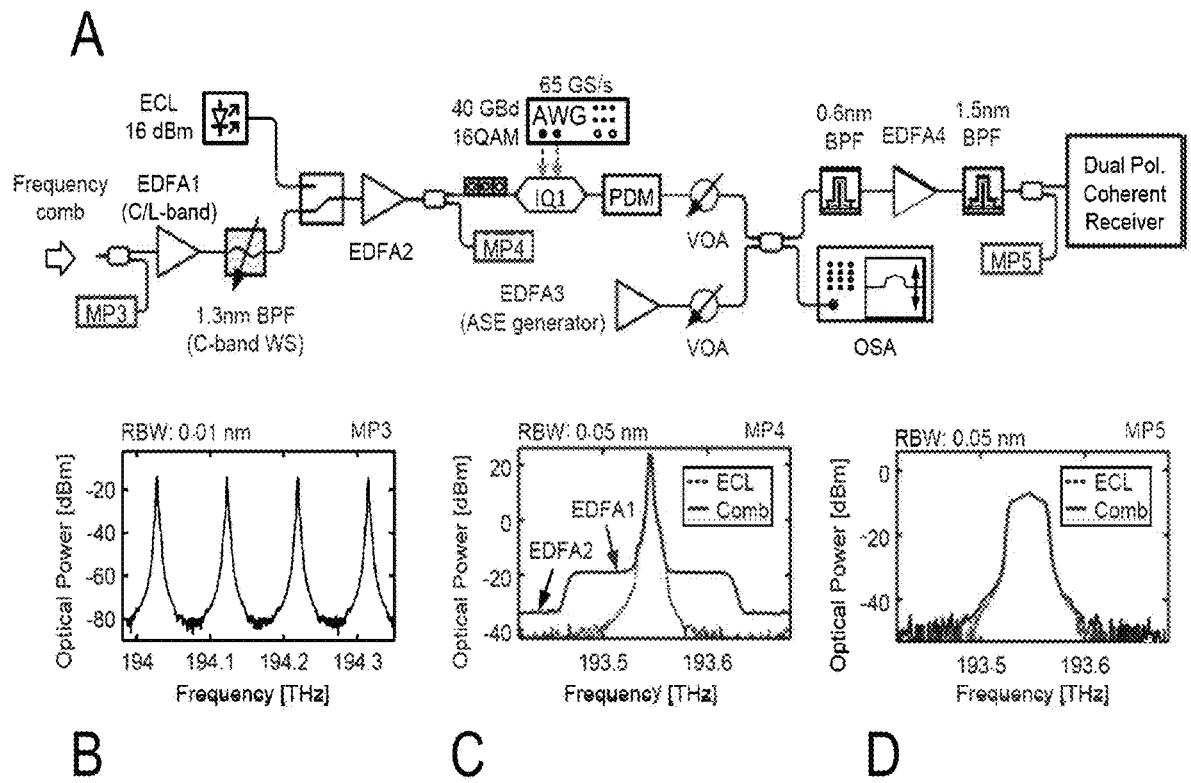
FIG. 6: a comparison of isolated frequency comb carriers with ECL carriers for data transmission.

FIG. 6 illustrates further details of the OSNR penalty measurements, including a comparison of isolated frequency comb carriers with ECL carriers for data transmission.

FIG. 6A shows a setup for OSNR penalty measurements: The frequency comb is generated by FCG1, which is shown in FIG. 4A, and amplified by a C/L-band EDFA (EDFA1). A single carrier is selected from the comb by operating the C-band programmable filter (WS) as a band-pass filter (BPF) with a 1.3 nm (160 GHz) passband. Afterwards, the carrier under test, either the comb line or the ECL, is further amplified to 24 dBm by EDFA2 before being modulated with PDM-16QAM at 40 GBd. To adjust the optical signal-to-noise ratio (OSNR) of the signal, a noise-loading system is used, consisting of an ASE noise generator (EDFA3) and two VOA to modify the ASE noise power while feeding EDFA4 with a constant optical input power. The signal is sent to the receiver where it is further amplified and analyzed by an OMA. Labels MP3, MP4 and MP5 represent monitor ports where the spectra shown in FIGS. 6B, 6C and 6D, respectively, were recorded. These spectra have been corrected to take into account the tapping ratios of the respective power splitters.

FIG. 6B shows a section of the frequency comb spectrum (resolution bandwidth RBW=0.01 nm) as obtained from the output of FCG1. The carriers show an OCNR of approximately 50 dB at a reference bandwidth of 0.1 nm.

FIG. 6C shows a frequency comb (dark) and ECL (bright) carriers after EDFA2. The frequency comb carrier shows two noise floor levels: The high-power spectral shoulder around the carrier is caused by ASE from the C/L band EDFA (EDFA1), which is suppressed further away from the carrier by the 1.3 nm-wide BPF, whereas the low-power ASE noise background arises from EDFA2. The OCNR of the ECL carrier amounts to 58 dB, whereas an OCNR of 42 dB is achieved for the comb line at 193.56 THz, both measured at a reference bandwidth of 0.1 nm.

FIG. 6D shows a spectrum of the received modulated data for both the frequency comb and ECL carriers with 40 GBd PDM-16QAM modulation.

In an extra set of experiments, the inventors compared the 16QAM transmission performance of individual comb lines of our Kerr soliton frequency comb, featuring optical linewidths of approximately 300 KHz, to that of a high-quality ECL reference carrier (Keysight N7714A) with an optical linewidth of approximately 10 kHz. As a metric for the comparison the inventors used the optical signal-to-noise ratio (OSNR) penalty. For a given BER, the OSNR penalty is given by the dB-value of the ratio of the actually required OSNR to the OSNR that would be theoretically required in an ideal transmission setup. The corresponding setup for OSNR penalty measurements is depicted in FIG. 6A. The frequency comb from FCG1, FIG. 4A, is used, tapped directly after the FBG, and amplified by a C/L-band EDFA (EDFA1) to bring the comb to a level of approximately 5 dBm per carrier. The carrier under test is then selected by operating the C-band WS as a band-pass filter with a 1.3 nm (160 GHz) wide passband, and coupled to a C-band EDFA (EDFA2). The bandwidth of the WS is chosen to effectively suppress all the neighboring comb lines. For the reference transmission experiments, an ECL is directly connected to EDFA2. The carrier under test is then amplified to 24 dBm by EDFA2 before being modulated. We modulated the carrier using 40 GBd PDM-16QAM and investigated the signal quality in terms of BER of the received channel for different OSNR values of the signal. To adjust the OSNR of the signal, a noise-loading system is used, consisting of an ASE noise generator (EDFA3) and two VOA. The VOA are used to modify the ASE noise power while feeding EDFA4 with a constant optical input power. This assures that the same receiver sensitivity is attained for all OSNR values investigated. An optical spectrum analyzer (OSA, Ando AQ6317B) is used to measure the OSNR at the input of the receiver. For each OSNR value, the quality of the channels is determined by the measured BER using our previously described receiver configuration that consists of two BPF, an EDFA (EDFA4), and an OMA.

A section of the comb spectrum recorded at MP3 and showing four carriers of the unmodulated frequency comb is depicted in FIG. 6B. Here, the comb carriers still show an OCNR of approximately 50 dB measured at 0.1 nm reference bandwidth. This value, however, cannot be maintained throughout the setup and is reduced by the noise of the subsequent amplifiers. After filtering by the 1.3 nm BPF, the carrier under test features an optical power of approximately 0 dBm. Note that this is a much lower power level than the 16 dBm of output power generated by the ECL. To enable a fair comparison that also accounts for the superior per-carrier power levels of the ECL, we decided to use the ECL at its full output power rather than attenuating it to the 0 dBm provided by the comb source. As a consequence, we find an OCNR of 58 dB of the ECL carrier after EDFA2, which is higher than the 42 dB achieved for the amplified comb line at 193.56 THz, see spectra in FIG. 6C, measured at MP4. Note that two noise floor levels can be identified for the comb carrier. The high-power spectral shoulder around the carrier, which is used to calculate the OCNR, is caused by the noise of EDFA1 and is suppressed further away from the carrier by the 1.3 nm BPF, whereas the low-power background arises from the noise of EDFA2. Hence, the maximum achievable OSNR for transmission with the comb line is dictated by ASE noise of the C/L-band EDFA (EDFA1) right after the FCG. An exemplary data signal spectrum for the ECL (red) and comb (blue) carriers before entering the coherent receiver is shown in FIG. 6D as measured at MP5. Both signal present practically the same optical power, which is determined by the output power of EDFA4.

Results of the OSNR penalty measurements are depicted in FIG. 2F described above. The carriers derived from the frequency comb source exhibit no additional implementation penalty in comparison to those generated by the reference ECL. However, the higher OCNR provided by the ECL may translate into longer transmission link, which makes DKS frequency comb sources suitable for metro and regional distances. The same results were also obtained when comparing ECL and comb carriers at symbol rates of 28 GBd, 32 GBd and 42.8 GBd.

Second Embodiment of the Invention

According to the second embodiment of the invention, coherent detection using a Kerr soliton frequency comb as a multi-wavelength local oscillator (LO) is demonstrated. The LO comb is coarsely synchronized to the transmitter comb while digital signal processing is used to account for remaining frequency differences. Using 99 WDM channels in the C and L band and operating each channel with 16QAM at 50 GBd, an aggregated line rate (net data rate) of 39.6 Tbit/s (34.6 Tbit/s) is transmitted. The results indicate the tremendous potential of Kerr soliton combs, not only as optical sources for massively parallel WDM transmission but also as multi-wavelength local oscillators for massively parallel coherent reception. Such devices are of great interest for optical interconnects within and between large-scale data-centers[36].

Figure 3:
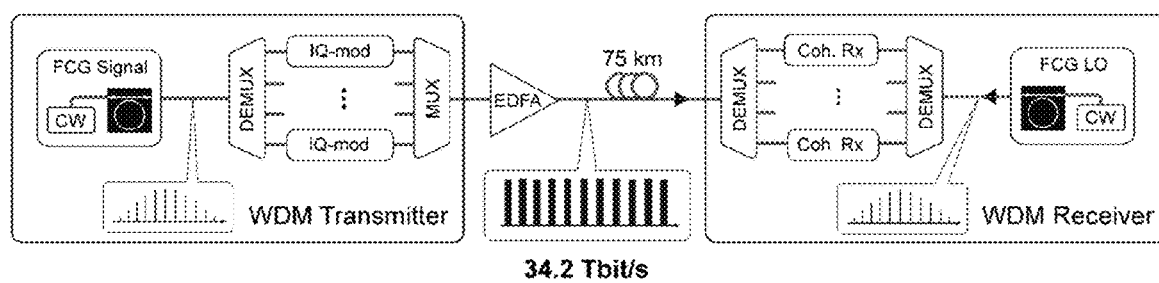
FIG. 3: a schematic illustration of coherent data transmission with dissipative Kerr soliton (DKS) frequency combs both at the transmitter and at the receiver side according to a second embodiment of the invention.
Figure 3:
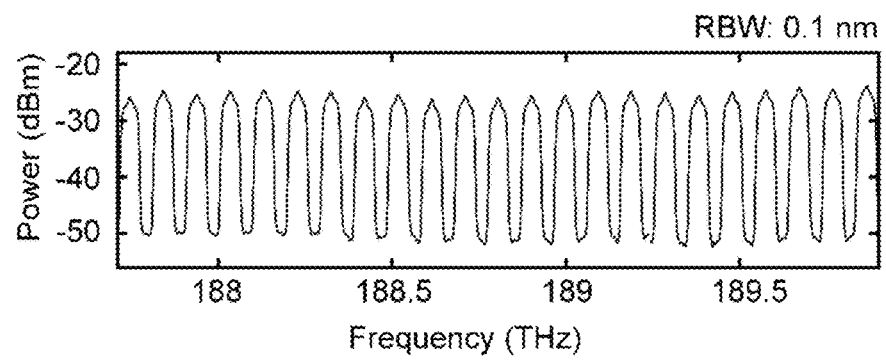
Figure 3:
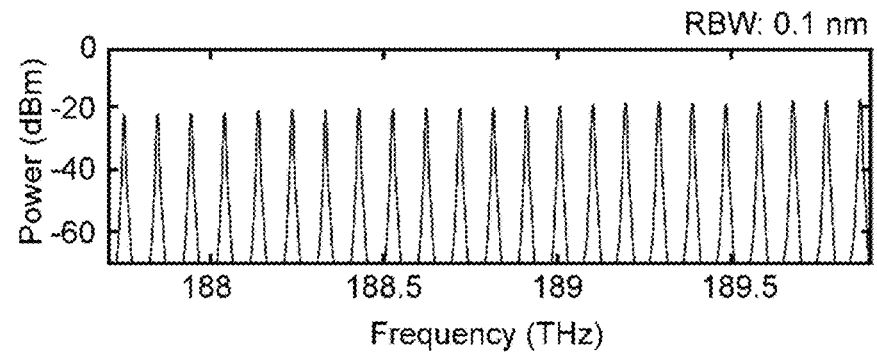
Figure 3:
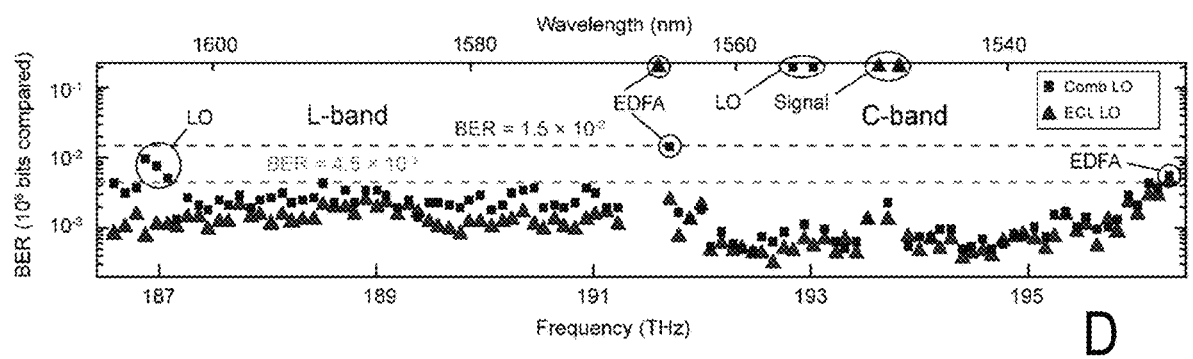

FIG. 3 shows coherent data transmission with dissipative Kerr soliton (DKS) frequency combs both at the transmitter and at the receiver side.

FIG. 3A shows massively parallel WDM data transmission schematic using DKS frequency combs both as multi-wavelength source at the transmitter and as multi-wavelength local oscillator (LO) at the receiver. In contrast to FIG. 2A, a single optical source provides all required LO for coherent detection. An extra DEMUX is used to route each LO tone to the respective coherent receiver (Coh. Rx).

FIG. 3B shows a section of the spectrum of the transmitted channels.

FIG. 3C shows a section of the spectrum of the DKS frequency comb used for coherent detection. The comparatively large width of the spectral lines is caused by the resolution bandwidth (RBW) of the spectrometer (RBW: 0.1 nm) d. Measured BER for each data channel. Blue squares show the results obtained when using a DKS comb as multi-wavelength LO, and red triangles correspond to a reference measurement using a high-quality ECL as LO. Dashed lines mark the BER thresholds of $4.5\times10^{-3}$ ($1.5\times10^{-2}$) for hard-decision (soft-decision) FEC with 7% (20%) overhead. Black circles show the channels with BER above the threshold for 7% FEC and specify the reasons for low signal quality: low OCNR of the carriers from the LO comb (LO) and the signal comb (Signal), as well as bandwidth limitations of the C-band EDFA (EDFA).

With more details, to demonstrate the potential of DKS frequency combs as multi-wavelength LO at the receiver, the second embodiment was conducted as shown in FIG. 3. According to FIG. 3A, at the transmitter, a DKS comb generator with an FSR of e. g. approximately 100 GHz provides a multitude of optical carriers for massively parallel WDM transmission. At the receiver, a second DKS comb source having roughly the same FSR is used to generate all LO tones simultaneously. The LO tones, featuring each an optical linewidth of e. g. approximately 300 KHz, are separated by a DEMUX and fed to an array of coherent receivers (Coh.Rx). FIGS. 3B and 3C show a section of the transmitted data spectrum along with the corresponding section of the LO comb. In the experiment, an emulation of WDM and PDM at the transmitter is used as described with reference to FIG. 5 below.

Figure 7:
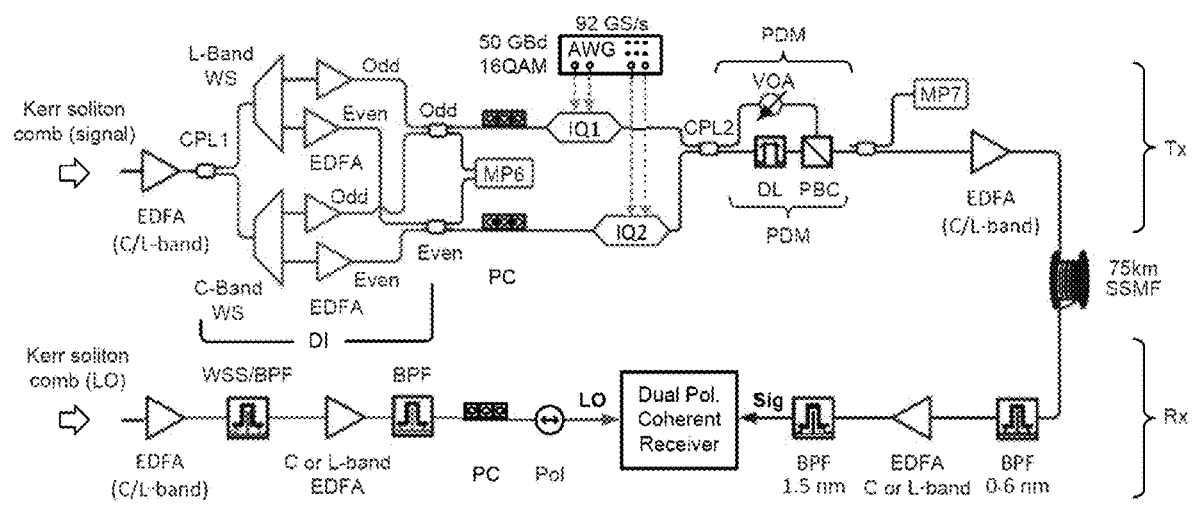
FIG. 7: a schematic illustration of further features of the second or third embodiments of the invention.
Figure 7:
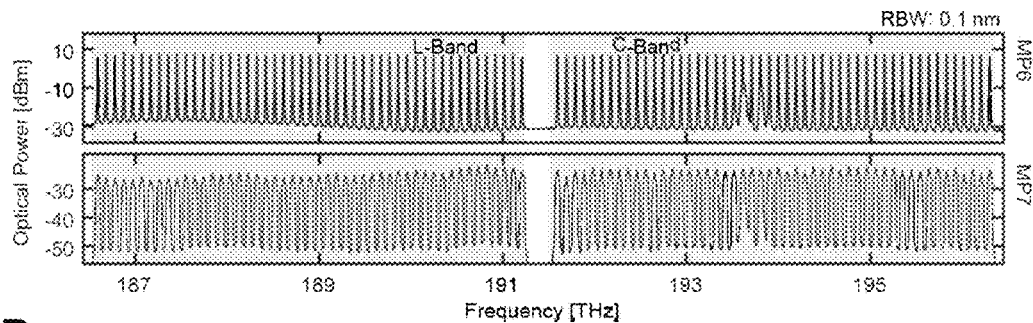

At the receiver, an optical band-pass filter is used to extract the tone of interest from the LO comb for individual reception and characterization by a modulation analyzer, see FIG. 7 and description thereof for more details. The measured BER for all 99 transmitted channels is depicted in FIG. 3D by squares. A total of 89 channels perform better than the BER threshold for hard-decision FEC with 7% overhead ($4.5\times10^{-3}$), and additional four channels are below the BER limit of $1.5\times10^{-2}$ for soft-decision FEC with 20% overhead. Overall, an aggregate data rate of 34.6 Tbit/s is obtained. As a reference, the same experiment was repeated using a high quality ECL as an LO, featuring an optical linewidth of less than 10 kHz. The resulting BER values are shown in FIG. 3D by triangles. The black circles show the channels with BER above the threshold for 7% FEC and specifies the reasons for low signal quality: low optical signal-to-noise ratio (OCNR) of the carriers from the LO comb (LO) and the signal comb (Signal) as well as bandwidth limitations of the C-band EDFA (EDFA). Apart from these effects, we cannot observe any considerable penalty that could be systematically attributed to using the DKS comb tone as an LO. This clearly demonstrated the tremendous potential of exploiting the scalability advantages of DKS combs for coherent reception of massively parallel WDM signals.

In summary, the potential of using chip-scale dissipative Kerr soliton frequency comb generators for massively parallel wavelength-division multiplexing at data rates of tens of terabit/s optical communications was demonstrated by the invention. Using a pair of interleaved frequency combs as optical source at the transmitter, a total net data rate (line rate) of 50.2 Tbit/s (55.0 Tbit/s) is obtained which is sent over an communication channel, e. g. 75 km of standard single-mode fiber in a spectral bandwidth of 9.675 THz. The inventors have shown that the transmitted comb lines do not exhibit additional implementation penalty compared to optical carriers derived from conventional high-quality external cavity lasers (ECL). Moreover the inventors have demonstrated data transmission at 34.6 Tbit/s using DKS combs as multi-wavelength source at the transmitter and as multi-wavelength LO at the receiver. Importantly, the inventors proved that there is no systematic penalty when replacing the high quality individual lasers at the receiver by our DKS comb source.

While the practical examples demonstrate the highest data rate achieved with chip-scale frequency comb sources so far, there is still room for improving the transmission capacity by exploiting further frequency bands and by optimizing the various components of the transmission system. The results proof the tremendous capacity of DKS comb generators in high-speed optical interconnects within and between large-scale data-centers[36].

Further details of coherent detection using a Kerr soliton frequency comb as multi-wavelength local oscillator are shown in FIG. 7 (all soliton data transmission setup using a dissipative Kerr soliton (DKS) frequency comb as a multi-wavelength local oscillator for coherent detection).

FIG. 7A shows the data transmission setup: Two independent DKS frequency comb generators provide both the carriers for WDM coherent data transmission (signal) and for parallel intradyne detection (LO). At the Transmitter side (Tx), WDM is emulated by encoding independent data into neighboring carriers. For that purpose, the comb is divided into even and odd carriers by a dis-interleaver (DI) stage.

The DI stage contains a directional coupler (CPL1) that divides the optical power into two parts, which are fed to a C-band and an L-band programmable filter (WS) to select even and odd set of carriers within the respective band. Each set of carriers is amplified by an additional EDFA to compensate for the optical losses caused by the dis-interleaving. Next, the C- and L-band carriers from each set are recombined by a directional coupler and sent through two different optical IQ-modulators (IQ1, IQ2). Both modulators are driven by a high-speed arbitrary waveform generator (AWG). The AWG generates independent pseudo-random bit sequences (PRBS) of length $2^{11}-1$ at a symbol rate of 50 GBd, which are encoded on each frequency comb carrier using 16QAM and raised-cosine pulse shaping with a roll-off factor $\beta=0.1$. After combining the signals by a directional coupler (CPL2), polarization division multiplexing (PDM) is emulated by splitting the data stream into two paths and recombining them on orthogonal polarizations with a decorrelating delay in one path and an attenuator in the other for maintaining the same power levels The PDM signal is amplified and transmitted through a 75 km long standard single mode fiber (SSMF). At the receiver side (Rx), the LO carriers and the transmitted channels are filtered and amplified before reception by a dual-polarization coherent receiver which performs digital signal processing (DSP) on the digitized signal. A polarization controller (PC) and polarizer are used to adjust the LO-line to the pre-defined input polarization of the coherent receiver. The spectra recorded at monitor ports (MP) 6 and 7 are shown in panels B and C.

FIG. 7B shows the spectrum of the combined odd and even carriers prior to modulation. The flat spectrum is achieved by adjusting the WS to compensate for the power differences of the frequency comb carriers and the spectral variations of the EDFA gain profiles.

FIG. 7C shows the spectrum of the data channels prior to fiber transmission. Note that the bias point of the modulators needs to be adjusted along the bandwidth, approximately, every 15 channels. This graphic is then constructed from the combination of the spectral regions where the modulators are adjusted.

With more details, FIG. 7A shows the WDM data transmission setup with a DKS frequency comb generator (FCG) as a multi-wavelength source at the transmitter (signal) and as a multi-wavelength local oscillator at the receiver (LO). The micro-resonator used at the transmitter side (Tx) corresponds to M1 from FIG. 4A. To provide the multi-wavelength LO, an additional micro-resonator (M3) with similar quality factor is used at the receiver side. Both combs are matched in absolute frequency position by adjusting the micro-resonators' temperature. The pump frequency for the signal (LO) comb is 193.56 THz (192.89 THz), the on chip pump power is 32.5 dBm (32 dBm) and the temperature is set to 16.4° C. (23.4° C.). We chose to pump the aforementioned resonances as they present the highest power conversion efficiency. The frequency comb obtained from M3 features a slightly lower FSR of approximately 95.70 GHz as compared to that of M1, FSR=95.80 GHz, due to fabrication inaccuracies. When using the carriers from M3 as LO for coherent detection, such difference in FSR translates into a non-zero intermediate frequency (IF). The IF can be brought down to values below 100 MHz near the center of the frequency combs at around 191.5 THz but it reaches relatively high frequencies of approximately 4 GHz when coherently demodulating the signals at the low frequency edge of the L band and at the high frequency edge of the C band. The high IF, however, did not prohibit data transmission as it could be removed using digital signal processing after detection of the transmitted signal with our coherent receiver. However, for high IF, the received signal is slightly affected by the limited bandwidth (BW=33 GHz) of the analog to digital convertor (ADC) of our coherent receiver. This leads to a reduction of the electrical power, and thus of the electrical signal-to-noise ratio, of our baseband signal. The high IF, nonetheless, can be avoided by carefully matching the FSR of the two Kerr soliton frequency combs during fabrication.

WDM transmission is again emulated by encoding independent data streams on adjacent channels, as already depicted in FIG. 5A. To this end, the transmitter frequency comb (signal) is dis-interleaved into even and odd carriers using two programmable filters (WS) for the C band and the L band. After amplifying the respective carriers by C- and L-band EDFA operated at 24 dBm output power, the odd (even) carriers of C and L band are combined by directional couplers and sent through optical IQ-modulators IQ1 (IQ2). Note that the C/L MUX of the dis-interleaver (DI) stage from FIG. 5A has been replaced by a directional coupler to avoid the power attenuation of the carriers at the low-frequency edge of the C-band, which was described with reference to FIG. 5.

The WS are in addition adjusted to compensate the power differences of the carriers and the spectral variations of the EDFA gain profile, thereby producing an overall flat spectrum at the input of IQ1 and IQ2, which is to be seen in FIG. 7B, measured at monitor port MP6. The modulators are driven by a high-speed arbitrary waveform generator (AWG, Keysight M8196A) with pseudo-random bit sequences (PRBS) of length $2^{11}-1$.

A 16QAM format and a symbol rate of 50 GBd was used, with raised-cosine pulse shaping at a roll-off factor of $\beta=0.1$. The larger analog bandwidth of this AWG (32 GHz) allowed us to use higher baud rates as compared to the experiments described with reference to FIG. 5. Polarization-division multiplexing (PDM) is emulated by temporally delaying one of the polarizations using a delay line (DL) and combining on orthogonal polarizations in a polarization beam combiner (PBC). The signal spectrum is shown in FIG. 7C, measured at monitor port MP7. The WDM data stream is amplified and transmitted over 75 km of standard single-mode fiber (SSMF). At the receiver (Rx), each transmitted channel is selected individually by an optical tunable band-pass filter (BPF), followed by an EDFA and a second BPF to suppress ASE noise.

The selected channel is then sent to a dual-polarization coherent receiver which, in contrast to the data transmission experiment described with reference to FIG. 5, uses a spectral line from the Kerr soliton comb at the receiver side as a local oscillator (LO). The optical path followed by the LO is marked on the left side of the coherent receiver in FIG. 7A.

A BPF (wavelength selective switch, WSS) selects the LO carrier from the L(C) band that matches the carrier frequency of the selected WDM channel. The WSS could not be used for selecting LO carriers in the L-band due to its limited optical bandwidth. The selected LO carrier is then amplified by a C- or L-band EDFA, filtered with a second BPF to suppress the ASE from the EDFA, and fed as an LO to the dual-polarization coherent receiver which consists of an optical modulation analyzer (OMA, Keysight N4391A) together with two real-time oscilloscopes (Keysight DSO-X 93204A 80 GSa/s). The detected signal undergoes a number of digital post processing stages comprising digital low-pass filtering, polarization demultiplexing, chromatic dispersion compensation, frequency offset estimation, carrier phase estimation and adaptive equalization.

The block length for performing signal processing is chosen to be 1024 symbols, which is optimized to track the varying physical quantities of the received signal, such as carrier phase and polarization. The measured BER (averaged from different recordings with a length of $10^6$ bit) for all transmitted channels is given in FIG. 3D of the main paper.

Third and Further Embodiments of the Invention

Figure 8:
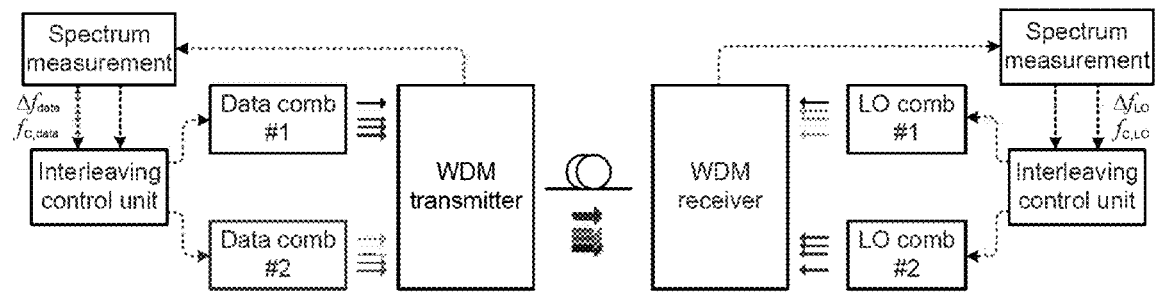
FIG. 8: schematic illustration of further general features of the preferred embodiments of the invention.
Figure 8:
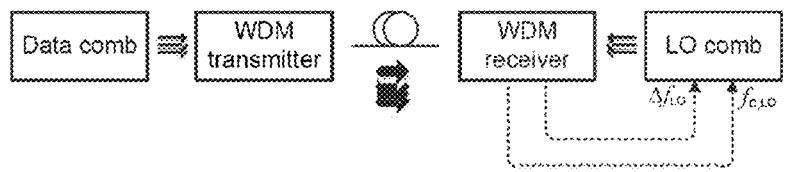
Figure 8:
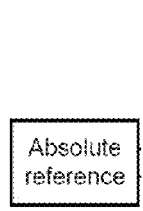

FIG. 8 generally illustrates further features of the embodiments of the invention, in particular including the third embodiment with single soliton micro-resonators at both of the transmitter and receiver sides.

FIG. 8A shows the inventive principle of using interleaving combs. First frequency comb (data comb #1) and second frequency comb (data comb #2) are tuned such that their spectral lines are interleaved by regulating both their central frequency and free spectral range (FSR). The FSR and central frequency of the interleaved frequency combs are synchronized using acquired data from a spectrum measurement unit. It is possible to have data comb #1 as free-running and regulate data comb #2 to maintain the interleaving The same scheme can be used to obtain an interleaved LO comb at the receiver side, as illustrated in FIG. 8A. This interleaving concept can be extended to more than two combs on at least one, preferably both, of the transmitter and receiver sides.

FIG. 8B shows the use of a frequency comb as the LO according to a first approach. The first frequency comb (data comb) is free-running, while the second frequency comb (LO comb) tracks the first frequency comb using feedback signals from WDM receiver. The first frequency comb and/or second frequency comb can be single or interleaved combs.

FIG. 8B shows the use of a frequency comb as the LO according to a second approach. Both the data and LO comb center frequencies are synchronized to an absolute wavelength reference, and both the data and LO comb FSR are synchronized to an absolute RF reference.

The features of the invention disclosed in the above description, the drawings and the claims can be of significance both individually as well as in combination or sub-combination for the realization of the invention in its various embodiments.

The invention claimed is:

1. Signal processing apparatus, being configured for transmitting and receiving coherent parallel optical signals, comprising
   a transmitter apparatus including a first single soliton micro-resonator device and a modulator device, wherein
      the first single soliton micro-resonator device is adapted for creating a single soliton providing a first frequency comb, wherein the first frequency comb provides a plurality of equidistant optical carriers with a frequency spacing corresponding to a free spectral range of the first single soliton micro-resonator device, and
      the modulator device is adapted for modulating the optical carriers according to data to be transmitted, and
   a receiver apparatus including a coherent receiver device with a plurality of coherent receivers and a local oscillator device providing a plurality of reference optical signals, wherein the coherent receiver device and the local oscillator device are arranged for coherently detecting the transmitted modulated optical carriers, wherein the signal processing apparatus further includes
   at least one second single soliton micro-resonator device having a free spectral range being equal or approximated to the free spectral range of the first single soliton micro-resonator device and being adapted for creating at least one single soliton providing at least one second frequency comb, wherein the at least one second frequency comb provides at least one of additional optical carriers and the reference optical signals,
   a frequency tuning device being adapted for adjusting at least one of a central frequency of at least one of the first and second frequency combs and the free spectral ranges of at least one of the first and second single soliton micro-resonator devices, and
   a spectrum measurement unit being adapted for detecting spectral properties of the first and second frequency combs, wherein
   the frequency tuning device is adapted for at least one of matching the free spectral ranges of the first and second single soliton micro-resonator devices and adjusting the central frequencies of the first and second frequency combs using acquired data from the spectrum measurement unit, and
   the frequency tuning device comprises at least one temperature setting device being adapted for adjusting a temperature of at least one of the first and the second single soliton micro-resonator devices.

2. Signal processing apparatus according to claim 1, wherein
   the central frequencies of at least one of the first and second frequency combs are adjusted using an absolute optical wavelength reference.

3. Signal processing apparatus according to claim 1, wherein
   the free spectral ranges of at least one of the first and second single soliton micro-resonator devices are adjusted using an absolute RF wavelength reference.

4. Signal processing apparatus according to claim 1, wherein
   the at least one second single soliton micro-resonator device is arranged at the transmitter apparatus for creating the second frequency comb providing the additional optical carriers, and
   the transmitter apparatus includes a coupling device being arranged for interleaving the optical carriers of the first and second frequency combs.

5. Signal processing apparatus according to claim 4, further including
   a transmitter tuning device being adapted for adjusting at least one of a central frequency of at least one of the first and second frequency combs and the free spectral ranges of at least one of the first and second single soliton micro-resonator devices, wherein
   the transmitter tuning device is adapted for adjusting at least one of the central frequencies of the first and second frequency combs such that a mutual frequency offset of the first and second frequency combs is equal or approximated to a half free spectral range of the first single soliton micro-resonator device.

6. Signal processing apparatus according to claim 4, wherein
the coupling device is arranged between the first and at least one second single soliton micro-resonator devices and the modulator device.

7. Signal processing apparatus according to claim 4, further including
at least one third single soliton micro-resonator device being arranged at the transmitter apparatus and having a free spectral range being equal or approximated to the free spectral range of the first and second single soliton micro-resonator devices and being adapted for creating at least one single soliton providing at least one third frequency comb, wherein the at least one third frequency comb provides additional optical carriers, wherein
the coupling device is arranged for interleaving the optical carriers of the first, second and at least one third frequency combs.

8. Signal processing apparatus according to claim 1, wherein
the at least one second single soliton micro-resonator device is arranged at the receiver apparatus for creating the second frequency comb providing the reference optical signals.

9. Signal processing apparatus according to claim 8, further including
a receiver tuning device being adapted for adjusting at least one of a central frequency of at least one of the first and second frequency combs and the free spectral ranges of at least one of the first and second single soliton micro-resonator devices, wherein
the receiver tuning device is adapted for adjusting at least one of the central frequencies of the first and second frequency combs such that the central frequencies of the first and second frequency combs are equal or approximated to each other.

10. Signal processing apparatus according to claim 9, wherein
the receiver tuning device is adapted for adjusting the central frequency of the second frequency comb in dependency on feedback signals from the coherent receiver apparatus.

11. Signal processing apparatus according to claim 8, further including
at least one third single soliton micro-resonator device being arranged at the receiver apparatus and having a free spectral range being equal or approximated to the free spectral range of the first and second single soliton micro-resonator devices and being adapted for creating at least one single soliton providing at least one third frequency comb, wherein the at least one third frequency comb provides additional reference optical signals, and
a coupling device is arranged for interleaving the reference optical signals of the second and at least one third frequency combs.

12. Signal processing apparatus according to claim 1, wherein
the at least one second single soliton micro-resonator device is arranged at the transmitter apparatus for creating the second frequency comb providing the additional optical carriers and the transmitter apparatus includes a coupling device being arranged for interleaving the optical carriers of the first and second frequency combs, and a third single soliton micro-resonator device is arranged at the receiver apparatus for creating a single soliton providing a third frequency comb, wherein the third frequency comb provides the reference optical signals.

13. Signal processing apparatus according to claim 1, wherein
at least one of the single soliton micro-resonator devices is composed by a continuous wave pumped silicon nitride waveguide and resonator, embedded with silica on a silicon chip.

14. Signal processing apparatus according to claim 1, wherein
each of the single soliton micro-resonator devices includes a continuous wave (cw) laser arranged for providing cw laser light, and an optical micro-resonator comprising a resonator material, which has a third order (Kerr) nonlinearity and an anomalous resonator dispersion, wherein the cw laser is arranged for coupling the cw laser light into the optical micro-resonator.

15. Transmitter apparatus, being configured for transmitting coherent parallel optical signals, comprising
a first single soliton micro-resonator device being adapted for creating a single soliton providing a first frequency comb, wherein the first frequency comb provides a plurality of equidistant optical carriers with a frequency spacing corresponding to a free spectral range of the first single soliton micro-resonator device,
a second single soliton micro-resonator device having a free spectral range being equal or approximated to the free spectral range of the first single soliton micro-resonator device and being adapted for creating a single soliton providing a second frequency comb, wherein the second frequency comb provides additional optical carriers,
a modulator device being adapted for modulating the optical carriers according to data to be transmitted,
a frequency tuning device being adapted for adjusting at least one of a central frequency of at least one of the first and second frequency combs and the free spectral ranges of at least one of the first and second single soliton micro-resonator devices, and
a spectrum measurement unit being adapted for detecting spectral properties of the first and second frequency combs, wherein
the frequency tuning device is adapted for at least one of matching the free spectral ranges of the first and second single soliton micro-resonator devices and adjusting the central frequencies of the first and second frequency combs using acquired data from the spectrum measurement unit, and
the frequency tuning device comprises at least one temperature setting device being adapted for adjusting a temperature of at least one of the first and the second single soliton micro-resonator devices.

16. Receiver apparatus, being configured for receiving coherent parallel optical signals being generated with a first single soliton micro-resonator device for creating a single soliton providing a first frequency comb, wherein the first frequency comb provides a plurality of equidistant optical carriers with a frequency spacing corresponding to a free spectral range of the first single soliton micro-resonator device and a modulator device for modulating the optical carriers according to data to be transmitted, the receiver apparatus comprising
a coherent receiver device with a plurality of coherent receivers, and a local oscillator device providing a plurality of reference optical signals, wherein the local oscillator device includes a second single soliton micro-resonator device having a free spectral range being equal or approximated to the free spectral range of the first single soliton micro-resonator device and being adapted for creating a single soliton providing a second frequency comb, wherein the second frequency comb provides the reference optical signals, and the coherent receiver device and the local oscillator device are arranged for coherently detecting the transmitted modulated optical carriers, wherein the receiver apparatus further comprises a frequency tuning device being adapted for adjusting at least one of a central frequency of at least one of the first and second frequency combs and the free spectral ranges of at least one of the first and second single soliton micro-resonator devices, and a spectrum measurement unit being adapted for detecting spectral properties of the first and second frequency combs, wherein the frequency tuning device is adapted for at least one of matching the free spectral ranges of the first and second single soliton micro-resonator devices and adjusting the central frequencies of the first and second frequency combs using acquired data from the spectrum measurement unit, and the frequency tuning device comprises at least one temperature setting device being adapted for adjusting a temperature of at least one of the first and the second single soliton micro-resonator devices.

17. Signal processing method, including transmitting and receiving coherent parallel optical signals, using a transmitter apparatus with a first single soliton micro-resonator device and a receiver apparatus with a coherent receiver device having a plurality of coherent receivers and a local oscillator device providing a plurality of reference optical signals, comprising the steps of creating a single soliton with the first single soliton micro-resonator device, the single soliton providing a first frequency comb, wherein the first frequency comb provides a plurality of equidistant optical carriers with a frequency spacing corresponding to a free spectral range of the first single soliton micro-resonator device, and modulating the optical carriers according to data to be transmitted, and coherently detecting the transmitted modulated optical carriers with the coherent receiver device and the local oscillator device, wherein the signal processing method further includes the steps of creating at least one second frequency comb providing at least one of additional optical carriers and the reference optical signals, the at least one second frequency comb being created with at least one second single soliton micro-resonator device having a free spectral range being equal or approximated to the free spectral range of the first single soliton micro-resonator device and being adapted for creating at least one single soliton providing the at least one second frequency comb, adjusting at least one of a central frequency of at least one of the first and second frequency combs and the free spectral ranges of at least one of the first and second single soliton micro-resonator devices, wherein spectral properties of the first and second frequency combs are detected and the adjusting step is conducted using the detected spectral properties, and the adjusting step includes adjusting a temperature of at least one of the first and the second single soliton micro-resonator devices.

18. Signal processing method according to claim 17, wherein the central frequencies of at least one of the first and second frequency combs are adjusted using an absolute optical wavelength reference.

19. Signal processing method according to claim 17, wherein the free spectral ranges of at least one of the first and second single soliton micro-resonator devices are adjusted using an absolute RF wavelength reference.

20. Signal processing method according to claim 17, wherein the at least one second single soliton micro-resonator device is arranged at the transmitter apparatus, further including the steps of creating the second frequency comb providing the additional optical carriers, and interleaving the optical carriers of the first and second frequency combs with a coupling device.

21. Signal processing method according to claim 20, further including adjusting at least one of a central frequency of at least one of the first and second frequency combs and the free spectral ranges of at least one of the first and second single soliton micro-resonator devices, such that a mutual frequency offset of the first and second frequency combs is equal or approximated to a half free spectral range of the first single soliton micro-resonator device.

22. Signal processing method according to claim 20, further including the steps of creating at least one single soliton providing at least one third frequency comb, wherein the at least one third frequency comb provides additional optical carriers, using at least one third single soliton micro-resonator device being arranged at the transmitter apparatus and having a free spectral range being equal or approximated to the free spectral range of the first and second single soliton micro-resonator devices, wherein the interleaving step includes interleaving the optical carriers of the first, second and at least one third frequency combs.

23. Signal processing method according to claim 17, wherein the at least one second single soliton micro-resonator device is arranged at the receiver apparatus, further including the step of providing the reference optical signals with the at least one second single soliton micro-resonator device.

24. Signal processing method according to claim 23, further including adjusting at least one of a central frequency of at least one of the first and second frequency combs and the free spectral ranges of at least one of the first and second single soliton micro-resonator devices, such that the central frequencies of the first and second frequency combs are equal or approximated to each other.

25. Signal processing method according to claim 23, wherein the central frequency of the second frequency comb is adjusted in dependency on feedback signals from the coherent receiver apparatus.

26. Signal processing method according to claim 23, further including the steps of creating at least one single soliton providing at least one third frequency comb with at least one third single soliton micro-resonator device being arranged at the receiver apparatus and having a free spectral range being equal or approximated to the free spectral range of the first and second single soliton micro-resonator devices, wherein the at least one third frequency comb provides additional reference optical signals, and interleaving the reference optical signals of the second and at least one third frequency combs.

27. Signal processing method according to claim 17, including the steps of creating the second frequency comb providing the additional optical carriers with the at least one second single soliton micro-resonator device being arranged at the transmitter apparatus, interleaving the optical carriers of the first and second frequency combs, and creating a single soliton providing a third frequency comb with a third single soliton micro-resonator device being arranged at the receiver apparatus, wherein the third frequency comb provides the reference optical signals.

28. Transmitting method for transmitting coherent parallel optical signals, comprising the steps of creating a single soliton providing a first frequency comb with a first single soliton micro-resonator device, wherein the first frequency comb provides a plurality of equidistant optical carriers with a frequency spacing corresponding to a free spectral range of the first single soliton micro-resonator device, creating a single soliton providing a second frequency comb with a second single soliton micro-resonator device having a free spectral range being equal or approximated to the free spectral range of the first single soliton micro-resonator device, wherein the second frequency comb provides additional optical carriers, modulating the optical carriers according to data to be transmitted, and transmitting the modulated optical carriers to a communication channel, including the further steps of adjusting at least one of a central frequency of at least one of the first and second frequency combs and the free spectral ranges of at least one of the first and second single soliton micro-resonator devices, wherein spectral properties of the first and second frequency combs are detected and the adjusting step is conducted using the detected spectral properties, and the adjusting step includes adjusting a temperature of at least one of the first and the second single soliton micro-resonator devices.

29. Receiving method for receiving coherent parallel optical signals being generated with a first single soliton micro-resonator device for creating a single soliton providing a first frequency comb, wherein the first frequency comb provides a plurality of equidistant optical carriers with a frequency spacing corresponding to a free spectral range of the first single soliton micro-resonator device and a modulator device for modulating the optical carriers according to data to be transmitted, comprising the steps of coherently detecting the transmitted modulated optical carriers with a coherent receiver device having a plurality of coherent receivers and with a local oscillator device, wherein the local oscillator device includes a second single soliton micro-resonator device having a free spectral range being equal or approximated to the free spectral range of the first single soliton micro-resonator device and being adapted for creating a single soliton providing a second frequency comb, wherein the second frequency comb provides the reference optical signals, including the further steps of adjusting at least one of a central frequency of at least one of the first and second frequency combs and the free spectral ranges of at least one of the first and second single soliton micro-resonator devices, wherein spectral properties of the first and second frequency combs are detected and the adjusting step is conducted using the detected spectral properties, and the adjusting step includes adjusting a temperature of at least one of the first and the second single soliton micro-resonator devices.

\* \* \* \* \*